(12) United States Patent
Ikeda

(10) Patent No.: US 12,158,677 B2
(45) Date of Patent: Dec. 3, 2024

(54) DISPLAY DEVICE

(71) Applicant: Japan Display Inc., Tokyo (JP)

(72) Inventor: Masataka Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/426,348

(22) Filed: Jan. 30, 2024

(65) Prior Publication Data

US 2024/0264499 A1 Aug. 8, 2024

(30) Foreign Application Priority Data

Feb. 6, 2023 (JP) ................................ 2023-015941

(51) Int. Cl.
| | |
|---|---|
| *G02F 1/1362* | (2006.01) |
| *G02F 1/1343* | (2006.01) |
| *G02F 1/1368* | (2006.01) |
| *H01L 27/12* | (2006.01) |

(52) U.S. Cl.
CPC .. *G02F 1/136227* (2013.01); *G02F 1/136209* (2013.01); *G02F 1/136286* (2013.01); *G02F 1/1368* (2013.01); *H01L 27/1225* (2013.01); *H01L 27/124* (2013.01); *G02F 1/134309* (2013.01)

(58) Field of Classification Search
CPC ............. G02F 1/1333; G02F 1/133345; G02F 1/1335; G02F 1/133512; G02F 1/1343; G02F 1/134309; G02F 1/1362; G02F 1/136209; G02F 1/136227; G02F 1/136286; G02F 1/1368; H01L 27/1225; H01L 27/124

See application file for complete search history.

(56) References Cited

U.S. PATENT DOCUMENTS

| | | | |
|---|---|---|---|
| 8,247,276 B2 * | 8/2012 | Kondo | ................... H01L 21/477 438/164 |
| 2012/0162055 A1 * | 6/2012 | Hara | ...................... G02F 1/1362 438/34 |
| 2022/0004052 A1 | 1/2022 | Ohue | |

FOREIGN PATENT DOCUMENTS

JP 2020-160254 A 10/2020

* cited by examiner

*Primary Examiner* — Thoi V Duong
(74) *Attorney, Agent, or Firm* — XSENSUS LLP

(57) ABSTRACT

A display device includes a first conductive layer having a first region extending in a first direction and a second region intersecting the first region on a first substrate, a first insulating film arranged on the first conductive layer, an oxide semiconductor layer arranged along the second region on the first insulating film, a second conductive layer and a third conductive layer connected to the oxide semiconductor layer and arranged along the second region, a second insulating film arranged on the third conductive layer, and a pixel electrode arranged on the second insulating film, wherein the third conductive layer has a third region along the first direction and a fourth region along the second region, and the pixel electrode is connected to the third conductive layer in the third region via an opening in the second insulating film.

8 Claims, 14 Drawing Sheets

DISPLAY DEVICE

CROSS-REFERENCE TO RELATED APPLICATION

This application claims the benefit of priority to Japanese Patent Application No. 2023-015941, filed on Feb. 6, 2023, the entire contents of which are incorporated herein by reference.

FIELD

An embodiment of the present invention relates to a display device.

BACKGROUND

A transparent display that allows the background of one side to be visually recognizable from the other side has been developed in recent years (e.g., Japanese laid-open patent publication No. 2020-160254). An image can be viewed from both front and back surfaces in a transparent display, so that an image or a character can be viewed from two opposite directions with the transparent display interposed therebetween.

SUMMARY

The display device according to an embodiment of the present invention includes a first conductive layer having a first region extending in a first direction and a second region intersecting the first region on a first substrate, a first insulating film arranged on the first conductive layer, an oxide semiconductor layer arranged along the second region on the first insulating film, a second conductive layer and a third conductive layer connected to the oxide semiconductor layer and arranged along the second region, a second insulating film arranged on the third conductive layer, and a pixel electrode arranged on the second insulating film, wherein the third conductive layer has a third region along the first direction and a fourth region along the second region, and the pixel electrode is connected to the third conductive layer in the third region via an opening in the second insulating film.

DESCRIPTION OF EMBODIMENTS

Figure 1:
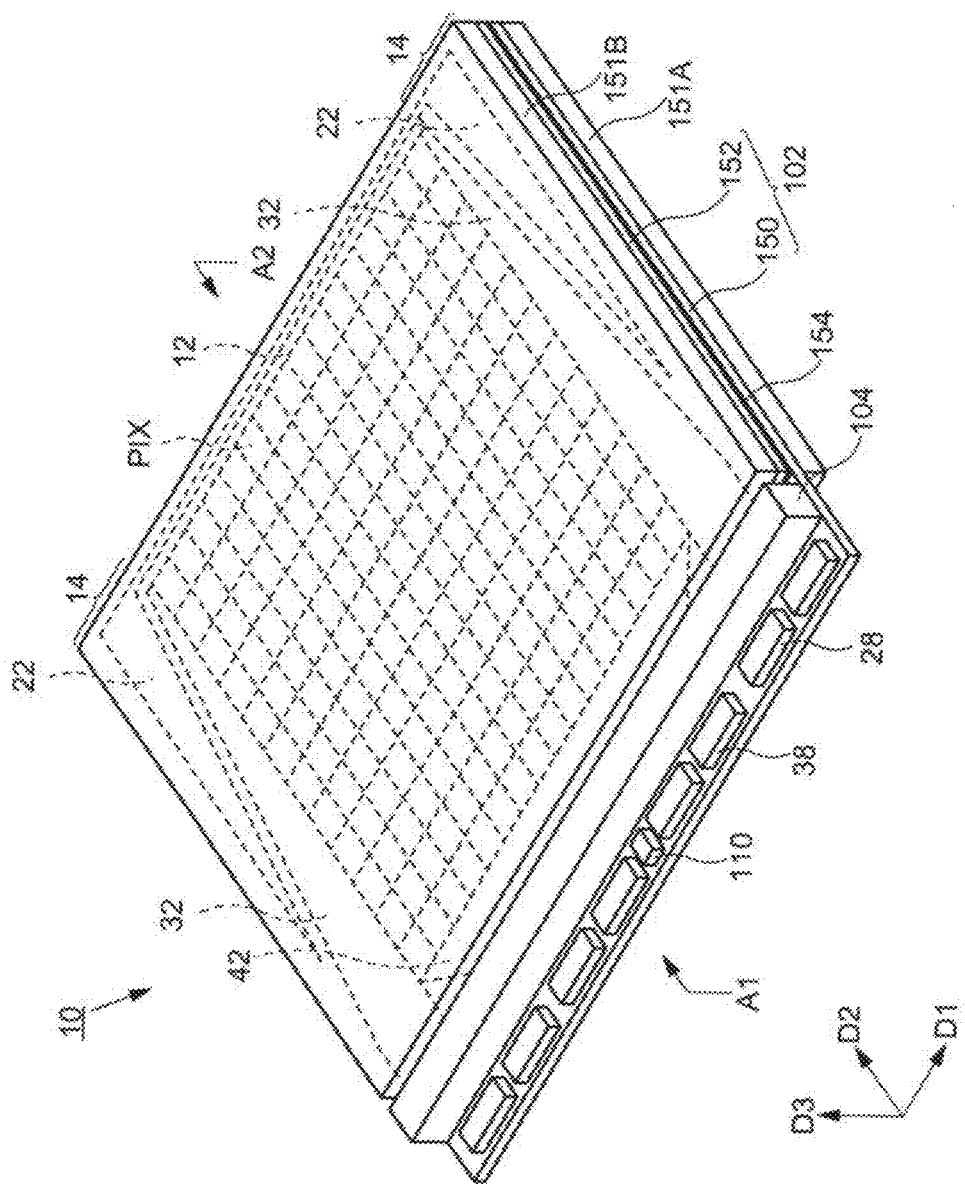
FIG. 1 is a perspective view illustrating an outline of a display device according to an embodiment of the present invention.

Hereinafter, embodiments of the present invention will be described with reference to the drawings and the like. However, the present invention can be implemented in various aspects without departing from the gist thereof, and is not to be construed as being limited to the description of the embodiments exemplified below. In order to make the description clearer with respect to the drawings, the width, thickness, shape, and the like of each part may be schematically represented in comparison with actual embodiments, but the schematic drawings are merely examples, and do not limit the interpretation of the present invention. Further, in the present specification and the drawings, the same or similar elements as those described with respect to the above-described drawings are denoted by the same reference signs, and redundant description may be omitted. In this specification and the like, ordinal numbers are given for convenience in order to distinguish parts, sites, and the like, and do not indicate priority or order.

In the case where a plurality of films is formed by processing a single film, the plurality of films may have different functions and roles, in the present invention. However, the plurality of films is derived from a film formed as the same layer in the same process, and has the same layer structure and the same material. Therefore, the plurality of films is defined as being present in the same layer. In addition, in the case where the plurality of films is formed by processing a certain film, in the present specification and the like, the films may be described separately using −1, −2, and the like.

In addition, expressions such as "above" and "below" represent a relative positional relationship between a structure of interest and other structures, in this specification and the like. In a side view, a direction from a first substrate to a pixel electrode, which will be described later, is defined as "above", and a reverse direction thereof is defined as "below", in the present specification and the like. The expression "above" in describing the manner of arranging another structure on a certain structure shall include both arranging another structure directly above a certain structure and arranging another structure over a certain structure via yet another structure, unless otherwise specified, in this specification and claims.

In addition, a bottom-gate drive is one in which on/off is controlled by a gate electrode arranged below a semiconductor layer, in this specification and the like. In addition, top-gate driving is one in which on/off is controlled by a gate electrode arranged above the semiconductor layer, in this specification and the like. Further, a dual-gate drive is one in which on/off is controlled by inputting the same control signal to the gate electrodes arranged above and below the semiconductor layer, in the present specification.

First Embodiment

A display device 10 according to an embodiment of the present invention will be described with reference to FIG. 1 to FIG. 13.

Outline of Display Device

FIG. 1 shows a perspective view of the display device 10 according to an embodiment of the present invention. The display device 10 includes a display panel 102 including an array substrate 150 (also referred to as a first substrate), a counter substrate 152 (also referred to as a second substrate), a liquid crystal layer (not shown) between the array substrate 150 and the counter substrate 152, a gate driving circuit 28, and a source driving circuit 38, a light source 104, and a first transparent substrate 151A and a second transparent substrate 151B sandwiching the display panel 102. One direction on the plane of the display panel 102 is referred to as a direction D1, a direction orthogonal to the direction D1 is referred to as a direction D2, and a direction orthogonal to a D1-D2 plane is referred to as a direction D3, in the following explanation referring to FIG. 1.

The array substrate 150 and the counter substrate 152 have light transmittance. The array substrate 150 and the counter substrate 152 are preferably transparent to visible light. The counter substrate 152 is arranged in the direction D3 so as to face the array substrate 150. The array substrate 150 and the counter substrate 152 are bonded to each other with a seal material 154 while being arranged opposite to each other with a gap therebetween. A liquid crystal layer (not shown) is arranged in the gap between the array substrate 150 and the counter substrate 152.

The display panel 102 has a display region 12 and a peripheral region 14 outside the display region 12. A plurality of pixels PIX is arranged in a row direction and a column direction in the display region 12. In this case, the row direction refers to a direction parallel to the direction D1, and the column direction refers to a direction parallel to the direction D2. m pixels are arranged in the row direction, and n pixels are arranged in the column direction, in the display region 12. The values of m and n are appropriately set in accordance with a display resolution in the vertical direction and a display resolution in the horizontal direction. A gate wiring (also referred to as a scanning signal line) is arranged in the direction D1, and a source wiring (also referred to as a data signal line) is arranged in the direction D2, in the display region 12.

The gate driving circuit 28 and the source driving circuit 38 are arranged in the peripheral region 14 of the array substrate 150. FIG. 1 shows an embodiment in which the gate driving circuit 28 and the source driving circuit 38 are provided as an integrated circuit (IC) and implemented in a COG (Chip on Glass) method in the array substrate 150. The gate driving circuit 28 and the source driving circuit 38 are not limited to the illustrated embodiment, and may be implemented in a COF (Chip on Film) method or may be formed by a thin film transistor (TFT) of the array substrate 150.

A gate wiring region 32, a common wiring region 22, and a source wiring region 42 are arranged in the peripheral region 14. The gate wiring region 32 is a region where a pattern formed by a wiring connecting the gate driving circuit 28 and a gate wiring GL arranged in the display region 12 is arranged. The common wiring region 22 is a region where a pattern formed by a common wiring is arranged. The common wiring region 22 is used as a wiring for applying a common voltage to a common electrode 218 (see FIG. 4) arranged in the counter substrate 152. The source wiring region 42 is a region where a pattern formed by a wiring connecting the source driving circuit 38 and a data signal line 109 arranged in the display region 12 is arranged.

The light source 104 has a structure along the direction D1. For example, the light source 104 is configured by a light-emitting diode (LED) arranged along the direction D1. A detailed structure of the light source 104 is not limited and may include an optical member such as a reflector, a diffuser, a lens, and the like, in addition to a light-emitting diode arranged in the direction D1. The light source 104 and a light emission control circuit 110 for controlling the light source 104 may be arranged as a separate member independent of the display panel 102. In addition, the light source 104 may be one in which light emission timing is controlled by the light emission control circuit 110 synchronized with the gate driving circuit 28 and the source driving circuit 38. The light emission control circuit 110 for controlling the light source 104 may be arranged as a separate member from the display panel 102, may be mounted on the array substrate 150 as a separate component, or may be incorporated in the gate driving circuit 28 or the source driving circuit 38, similar to the light source 104.

The first transparent substrate 151A and the second transparent substrate 151B are arranged so as to sandwich the display region 12 and the peripheral region 14. The first transparent substrate 151A and the second transparent substrate 151B have a function as a protective member of the display panel 102. In addition, the first transparent substrate 151A and the second transparent substrate 151B function as a light guide plate for introducing light emitted from the light source 104 into the display panel 102, as described with reference to FIG. 2.

Figure 2:
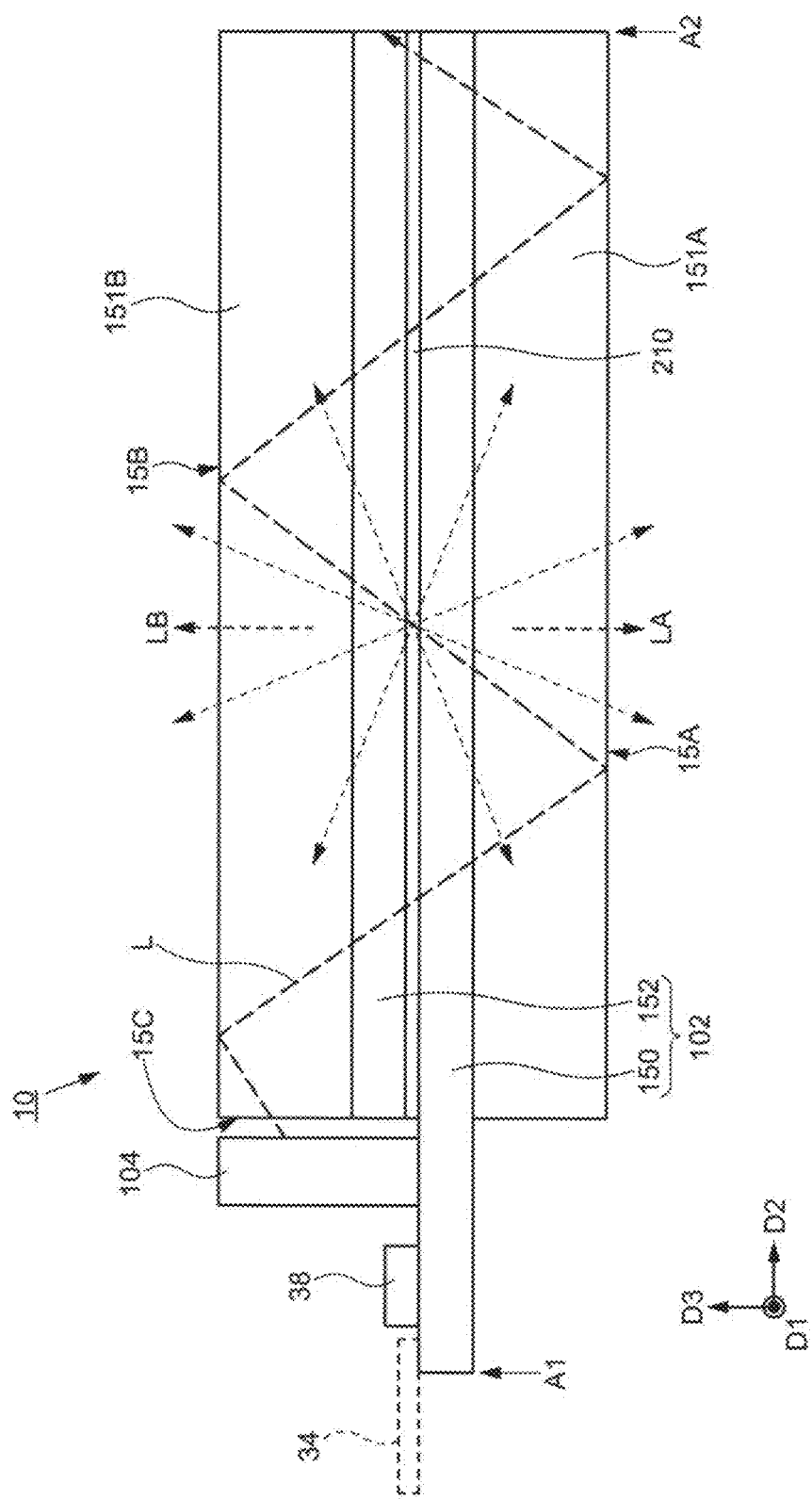
FIG. 2 is a schematic cross-sectional view showing a structure corresponding to A1-A2 of a display device shown in FIG. 1.

FIG. 2 shows a cross-sectional structure of the display device 10 corresponding to A1-A2 shown in FIG. 1. The first transparent substrate 151A is arranged on the array substrate 150 side of the display panel 102, and the second transparent substrate 151B is arranged on the counter substrate 152 side, as shown in FIG. 2. The first transparent substrate 151A and the second transparent substrate 151B may be a glass substrate or a plastic substrate. The first transparent substrate 151A and the second transparent substrate 151B preferably have refractive indices equivalent to those of the array substrate 150 and the counter substrate 152. The array substrate 150, the first transparent substrate 151A, and the counter substrate 152 and the second transparent substrate 151B are bonded to each other with a transparent adhesive (not shown).

The display panel 102 is arranged such that the array substrate 150 and the counter substrate 152 face each other, and a liquid crystal layer 210 is arranged therebetween. The array substrate 150 is larger than the counter substrate 152 and has a size such that part of the peripheral region 14 is exposed from the counter substrate 152. A driving circuit (the source driving circuit 38 in FIG. 2) is arranged in the array substrate 150. In addition, a flexible printed circuit 34 is attached to the periphery of the array substrate 150.

The light source 104 is arranged adjacent to one side surface of the first transparent substrate 151A or the second transparent substrate 151B. FIG. 2 shows a configuration in which the light source 104 is arranged along one side of the second transparent substrate 151B. In addition, although FIG. 2 shows a configuration in which the light source 104 is attached to the array substrate 150, the configuration is not limited to the configuration in which the light source 104 is arranged, and an attachment configuration is not limited as long as an attachment position can be fixed. For example, the light source 104 may be supported by a housing surrounding the display panel 102.

The light source 104 is arranged along a first side 15C of the second transparent substrate 151B, as shown in FIG. 2. The light source 104 irradiates the first side 15C of the second transparent substrate 151B with light L, as shown in FIG. 2. The light source 104 may also be referred to as a side light source because it emits the light L toward the first side 15C. The first side 15C of the second transparent substrate 151B facing the light source 104 serves as a light incident surface.

The light L incident from the first side 15C of the second transparent substrate 151B propagates in a direction away from the first side 15C (the direction D2) while being reflected by a second plane 15B of the second transparent substrate 151B and a first plane 15A of the first transparent substrate 151A, as schematically shown in FIG. 2. When the light L is directed to the outside from the first plane 15A of the first transparent substrate 151A and the second plane 15B of the second transparent substrate 151B, the light L proceeds from a medium having a large refractive index to a medium having a small refractive index. If the incident angle of the light L incident on the first plane 15A and the second plane 15B is larger than the critical angle in this case, the light L is totally reflected, and is guided to the direction D2 while being reflected by the first plane 15A and the second plane 15B.

The liquid crystal layer 210 is formed of a polymer-dispersed liquid crystal. A scattering state and a non-scattering state are controlled for each pixel PIX (see FIG. 1) in the liquid crystal layer 210 formed of the polymer-dispersed liquid crystal. At least part of the light L propagating while being reflected by the first plane 15A and the second plane 15B is scattered, when there is a pixel in which the liquid crystal layer 210 is in a scattered state, an incident angle of the scattered light becomes an angle smaller than the critical angle, scattered lights LA and LB are emitted to the outside from the first plane 15A and the second plane 15B, respectively, and the emitted scattered lights LA and LB are observed by an observer, as shown in FIG. 2. The array substrate 150, the counter substrate 152, the first transparent substrate 151A, and the second transparent substrate 151B have light transmittance (transparent to visible light) and are substantially transparent because the liquid crystal layer 210 is in a non-scattering state in a region except for the region where the scattered lights LA and LB are emitted, in the display panel 102, thereby allowing the observer to view a backside through the display panel 102.

Figure 3:
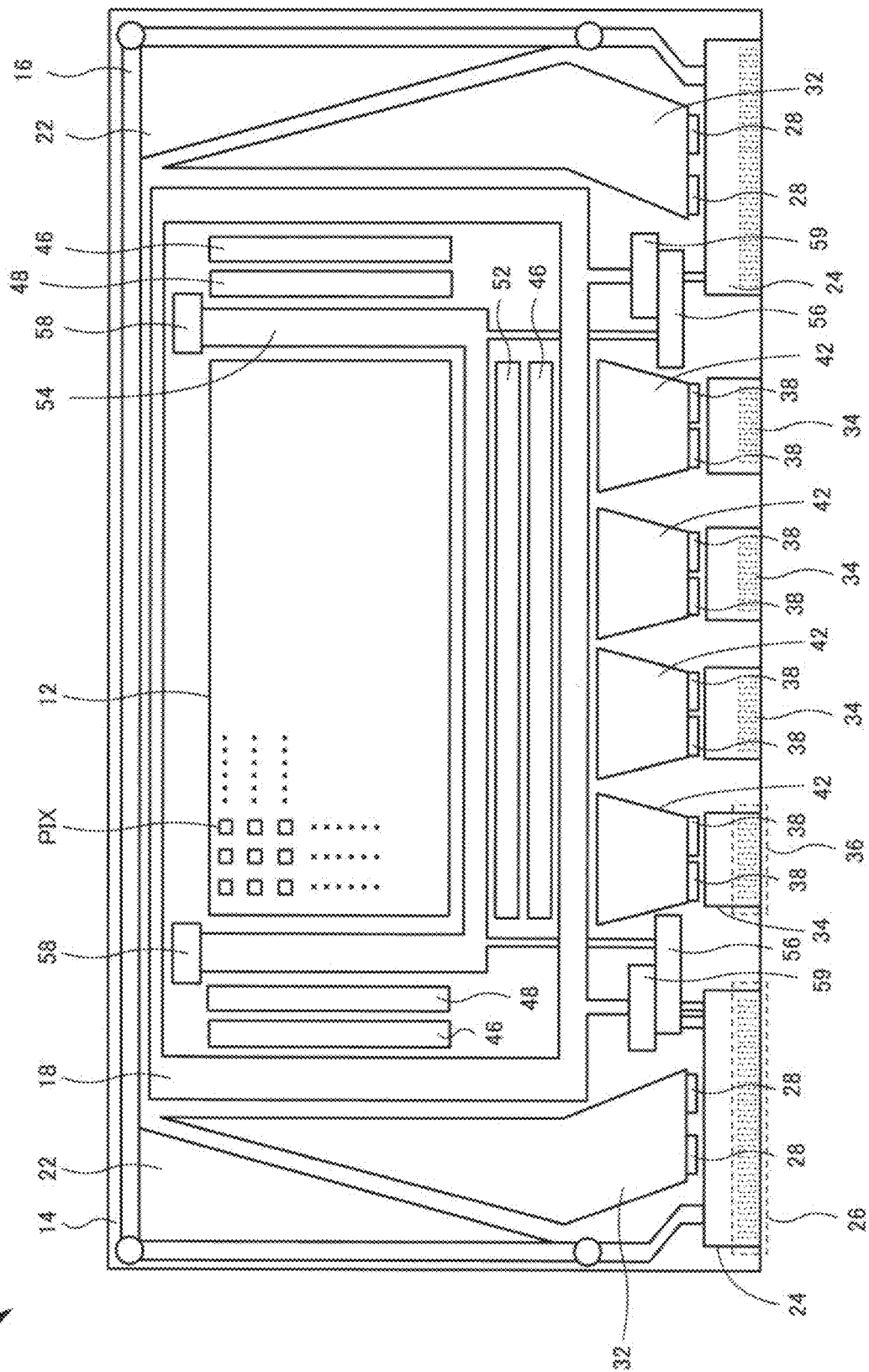
FIG. 3 is a plan view illustrating a configuration of a display device according to an embodiment of the present invention.

FIG. 3 is a plan view illustrating a configuration of the array substrate 150 of the display device 10 according to an embodiment of the present invention. The array substrate 150 includes the display region 12 and the peripheral region 14, as shown in FIG. 3.

The display region 12 includes the plurality of pixels PIX arranged in a matrix. Each of the plurality of pixels PIX includes a plurality of transistors and liquid crystal elements.

The peripheral region 14 is arranged to surround the display region 12. In addition, the peripheral region 14 refers to a region from the display region 12 to an edge of the array substrate 150, in the array substrate 150. In other words, the peripheral region 14 shall refer to a region except for the region where the display region 12 is arranged on the array substrate 150 (that is, a region outside the display region 12).

In addition to the gate driving circuit 28 and the source driving circuit 38, the gate wiring region 32, the source wiring region 42, common wirings 16 and 18, the common wiring region 22, terminal portions 26 and 36, flexible printed circuits 24 and 34, and various inspection circuits are arranged in the peripheral region 14. The terminal portions 26 and 36 are arranged along one side of the array substrate 150.

The flexible printed circuit 24 is connected to the terminal portion 26. The flexible printed circuit 24 outputs various signals to the gate driving circuit 28, the common wirings 16 and 18, an ESD protective circuit 59, and a QD pad 56. The gate driving circuit 28 is connected to a plurality of gate wirings GL, and each of the plurality of gate wirings GL is electrically connected to each of the plurality of pixels PIX in the display region 12. A region where the plurality of gate wirings GL is arranged is shown as the gate wiring region 32 and a detailed arrangement of the plurality of gate wirings GL is omitted, in FIG. 3. The number of gate wirings GL connected to the two gate driving circuits 28 corresponds to the number of rows of pixels PIX in the display region 12. In addition, although a configuration in which the gate wiring region 32 is arranged apart from the display region 12 is shown in FIG. 3, actually the gate wiring GL and the pixel PIX are electrically connected to each other.

The flexible printed circuit 34 is connected to the terminal portion 36. The flexible printed circuit 34 outputs a video signal to the source driving circuit 38. The source driving circuit 38 is connected to a plurality of source wirings SL, and each of the plurality of source wirings SL is electrically connected to each of the plurality of pixels PIX in the display region 12. A region where the plurality of source wirings SL is arranged is shown as the source wiring region 42, and a detailed arrangement of the plurality of source wirings SL is omitted, in FIG. 3. The number of source wirings SL connected to the eight source driving circuits 38 corresponds to at least three times the number of columns of pixels PIX in the display region 12. The case where the number of source wirings SL is four times the number of columns of pixels PIX in the display region 12 will be described in the present embodiment. In addition, although a configuration in which the source wiring region 42 is arranged apart from the display region 12 is shown in FIG. 3, actually the source wiring SL and the pixel PIX are electrically connected to each other.

The common wiring 18, an ESD protective circuit 46, a gate inspection circuit 48, and an inspection line 54 are arranged between the gate wiring region 32 and the display region 12. The common wiring 18, the ESD protective circuit 46, a source inspection circuit 52, and the inspection line 54 are arranged between the source wiring region 42 and the display region 12. The inspection line 54 is connected to an ESD protective circuit 58 and the QD pad 56. In addition, the common wiring 18 is connected to the ESD protective circuit 59.

The common wiring 16 is arranged so as to surround the peripheral region 14 in the array substrate 150, and a signal is supplied from the two flexible printed circuits 24. In addition, the common wiring 16 is electrically connected to the mesh-shaped common wiring region 22.

Pixel Circuit

Figure 4:
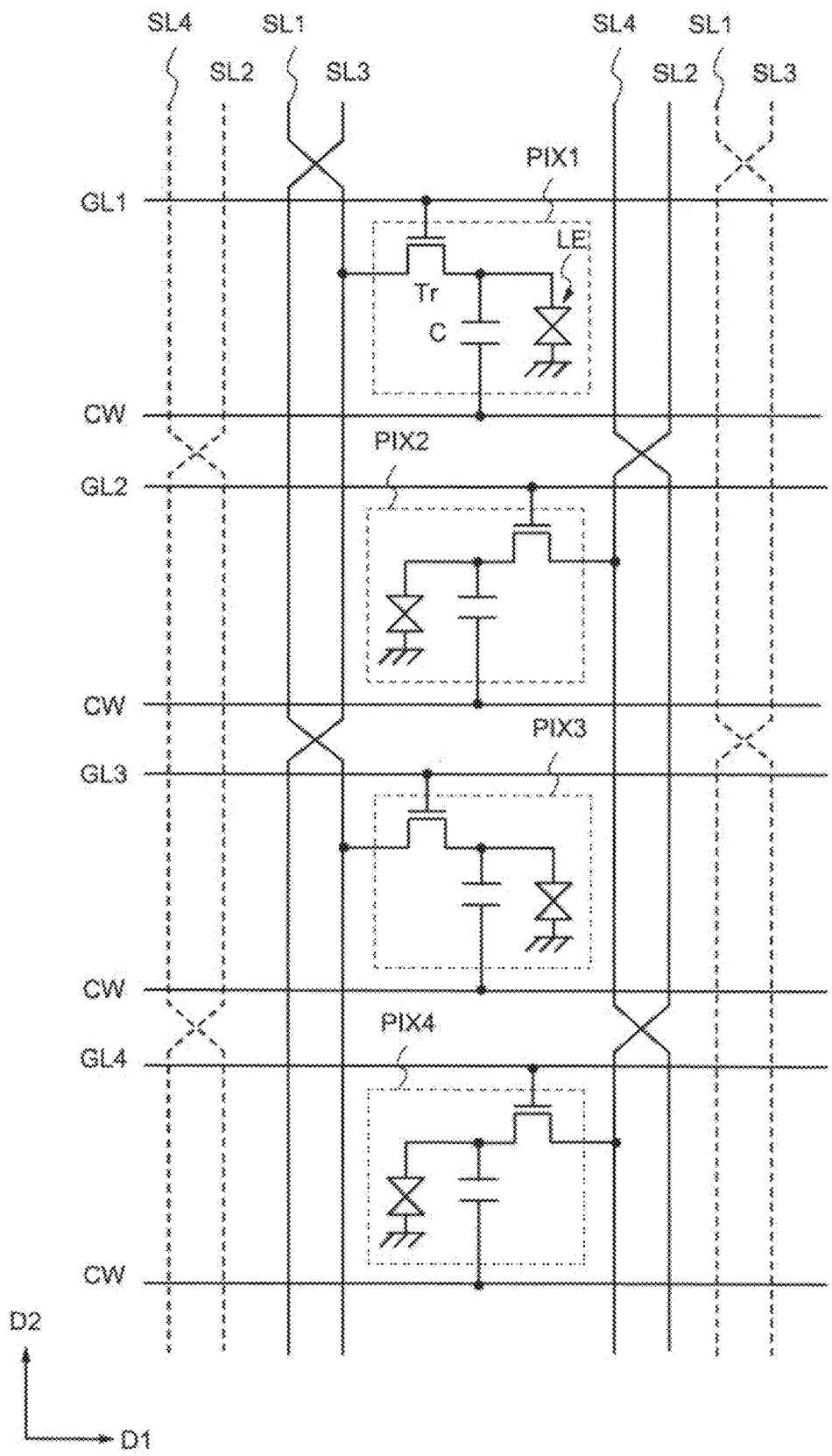
FIG. 4 is a block diagram showing pixels in a display device according to an embodiment of the present invention.

FIG. 4 is a diagram illustrating a pixel circuit of the pixel PIX included in the display device 10 according to an embodiment of the present invention. The display device 10 in which an on-voltage is simultaneously supplied to four gate wirings GL and four pixels PIX arranged in the column direction can be simultaneously charged by four source wirings SL will be described in the present embodiment. As a result, one horizontal period can be made longer than a horizontal period in line order. In other words, it is possible to reduce the time required for scanning all the pixel lines arranged in the display region 12 to ¼. Therefore, in a high-speed driving panel such as a transparent display or a large-sized panel, the charging period for the pixel PIX can be sufficiently secured. A configuration of the pixel PIX according to the present embodiment will be described in detail below.

Four pixels PIX1 to PIX4 are arranged in the column direction (the direction D2) in FIG. 4. Each of the four pixels PIX1 to PIX4 is electrically connected to each of the four gate wirings GL1 to GL4. In addition, each of the four pixels PIX1 to PIX4 is electrically connected to each of the four source wirings SL1 to SL4. Each of the four pixels PIX1 to PIX4 is connected to a capacitive wiring CW. In the case where the pixels PIX1 to PIX4 are not distinguished from each other in the following explanation, they are referred to as the pixel PIX. In the case where the gate wirings GL1 to GL4 and the source wirings SL1 to SL4 are not distinguished from each other, they are referred to as the gate wiring GL and the source wiring SL.

The pixel PIX includes a transistor Tr, a liquid crystal element LE, and a storage capacitor C. A gate of the transistor Tr is connected to the gate wiring GL, a source of the transistor Tr is connected to the source wiring SL, and a drain of the transistor Tr is connected to one electrode of the liquid crystal device LE and one electrode of the storage capacitor C. The other electrode of the liquid crystal device LE is connected to a common wiring CL. The other electrode of the storage capacitor C is connected to the capacitive wiring CW.

The transistor Tr has a function of controlling the writing time of the video signal supplied from the source wiring SL to the pixel PIX by switching between the on-state and the off-state. A potential corresponding to the video signal supplied from the source wiring SL can be written to the storage capacitor C electrically connected to the transistor Tr by turning on the transistor Tr. In addition, the potential held in the storage capacitor C can be held by turning off the transistor Tr.

Figure 5:
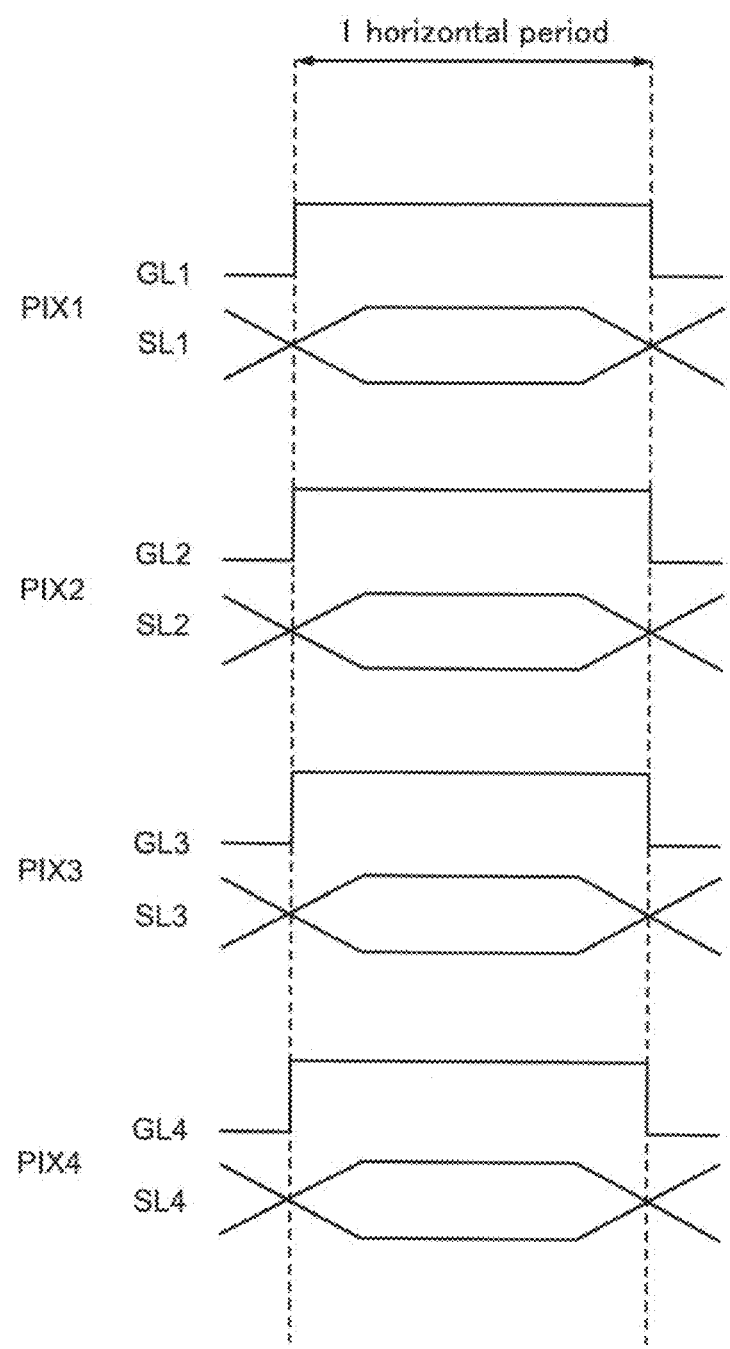
FIG. 5 is a timing chart of pixels in a display device according to an embodiment of the present invention.

FIG. 5 is a timing diagram of the display device 10 according to an embodiment of the present invention. Normally, the gate wiring GL sequentially charges the pixel columns arranged in the direction D2 by using the same source wiring SL by supplying the on-voltage row by row. On the other hand, the on-voltage is simultaneously supplied to the four gate wirings GL, so that the transistors Tr of each of the four pixels PIX are simultaneously turned on, in the present embodiment. The video signal is simultaneously supplied to the different source wirings SL1 to SL4 in this state. As a result, the four pixels arranged in the direction D2 can be driven simultaneously.

Planar Layout of Pixel

Figure 6:
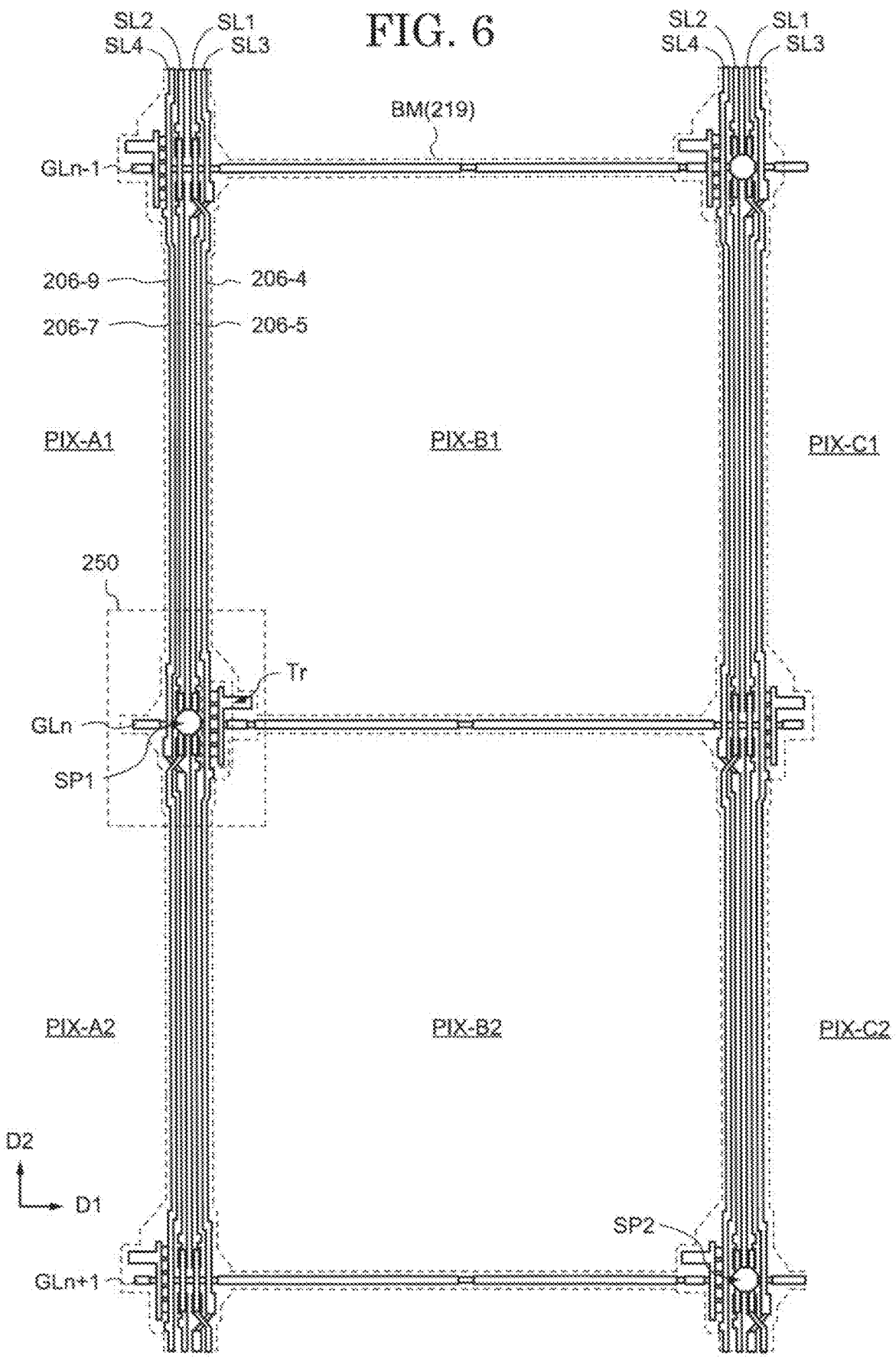
FIG. 6 is a planar layout of pixels in a display device according to an embodiment of the present invention.

A planar layout of pixels PIX in the display device 10 according to an embodiment of the present invention will be described with reference to FIG. 6. FIG. 6 shows a configuration in which a pixel PIX-A1, a pixel PIX-A2, a pixel PIX-B1, and a pixel PIX-B2 are in a plan view.

Gate wirings GLn−1 to GLn+1 are arranged along the direction D1, as shown in FIG. 6. In addition, the source wirings SL1 to SL4 are arranged along the direction D2. An opening region of the pixel PIX-B1 is a region surrounded by the adjacent gate wiring GLn−1, a gate wiring GLn, the source wiring SL1, and the source wiring SL4, in this case.

A black matrix BM (a light-shielding layer 219) is arranged to cover the gate wiring GL, the source wirings SL1 to SL4, and the transistor Tr.

The source wiring SL1 and the source wiring SL3 and the source wiring SL2 and source wiring SL4 are arranged so as to sandwich the pixels PIX-B1 and PIX-B2 of one column. In other words, the four source wirings SL1 to SL4 are arranged between one column of pixels and one column of pixels.

The transistor Tr is arranged in a region 250 where the gate wiring GL and the source wirings SL1 to SL4 intersect with each other. In addition, the transistor Tr is connected to the pixel electrode. The pixel electrode is arranged in the opening region of the pixel PIX-B1. In addition, a plurality of spacers SP is arranged so as to have regularity with respect to an intersection of the pixel PIX arranged in a matrix. For example, the plurality of spacers may be arranged every other row and every other column of the pixel PIX. In other words, the spacer SP may not be arranged at an intersection adjacent to the intersection where the spacer SP is arranged.

The source wiring SL2 and the source wiring SL4 are adjacent to the pixel PIX-A1 and the pixel PIX-A2, and the source wiring SL1 and the source wiring SL3 are adjacent to the pixel PIX-B1 and the pixel SL2, in the region 250 shown in FIG. 6 where the gate wiring GL and the source wirings SL1 to SL4 intersect with each other. To describe the position where the spacer SP is arranged, a spacer SP1 overlaps the source wiring SL3 adjacent to the pixel PIX-B1 and the pixel PIX-B2, and the source wiring SL2 adjacent to the pixel PIX-A1 and the pixel PIX-A2. A spacer SP2 overlaps the source wiring SL4 adjacent to the pixel PIX-B2 and the pixel PIX-B3 (not shown), and the source wiring SL3 adjacent to a pixel PIX-C2 and a pixel PIX-C3 (not shown). That is, the spacer SP is arranged above the inner two source wirings SL sandwiched between the outer two source wirings SL among the four source wirings SL adjacent to each other.

An aperture ratio of a pixel is one of the indicators for evaluating the display quality, in the display device. Since the background of one side is visually recognized from the other side in the transparent display, the transparency decreases when the aperture ratio is low. Therefore, it is required to further improve the aperture ratio of the pixel, in the display device.

Therefore, the aperture ratio of the pixel is improved in the display device 10 according to an embodiment of the present invention.

Figure 7:
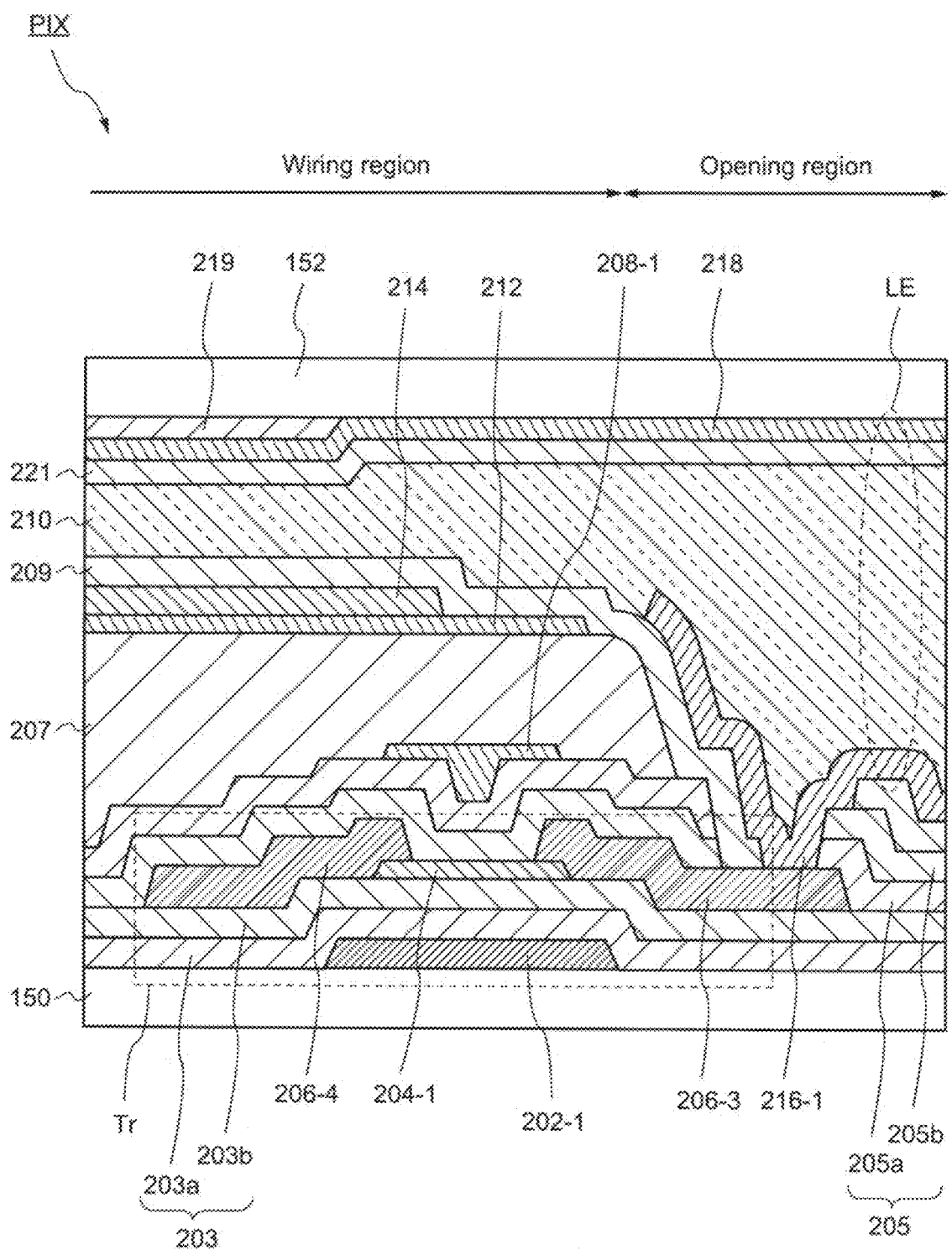
FIG. 7 is a cross-sectional view of a pixel in a display device according to an embodiment of the present invention.

FIG. 7 is a cross-sectional view in the display device 10. The stacking order of each layer when the display device 10 is viewed in a cross-section will be described in FIG. 7.

A conductive layer 202-1 is arranged above the array substrate 150, as shown in FIG. 7. A gate insulating film 203 is arranged above the conductive layer 202-1. An oxide semiconductor layer 204-1 is arranged above the gate insulating film 203. The oxide semiconductor layer 204-1 is arranged to face the conductive layer 202-1 via the gate insulating film 203. Conductive layers 206-3 and 206-4 are arranged above the oxide semiconductor layer 204-1. An insulating film 205 is arranged above the conductive layers 206-3 and 206-4. A conductive layer 208-1 is arranged above the insulating film 205.

The conductive layer 202-1 functions as the gate wiring GL (gate electrode), in the present embodiment. The conductive layer 206-3 functions as a drain electrode, and the conductive layer 206-4 functions as a source wiring SL (source electrode). The conductive layer 208-1 is connected to the gate wiring GL and functions as a back gate. The conductive layer 202-1, the oxide semiconductor layer 204-1, the insulating film 205, and the conductive layers 206-3 and 206-4 function as the transistor Tr. In addition, although the transistor Tr is described as a bottom-gate-driven transistor in the present embodiment, the present invention is not limited to this, and may be a top-gate-driven transistor or a dual-gate-driven transistor.

The gate insulating film 203 includes a stack of a nitride insulating film 203a and an oxide insulating film 203b, in the present embodiment. The insulating film 205 includes a stack of an oxide insulating film 205a and a nitride insulating film 205b. In addition, the oxide semiconductor layer 204-1 is sandwiched between the oxide insulating film 203b and the oxide insulating film 205a. The oxide insulating film 205a and the oxide insulating film 203b release oxygen during a process. The released oxygen may be supplied to the oxide semiconductor layer 204-1. This is preferable because oxygen defects in the oxide semiconductor layer 204-1 can be repaired.

A planarization film 207 is arranged above the conductive layer 208-1 and the insulating film 205. The planarization film 207 is arranged to reduce the unevenness of various wiring constituting the transistor Tr. In the case where the display device 10 is applied to the transparent display, the planarization film 207 is preferably removed in an opening region of the pixel PIX. As a result, it is possible to suppress the planarization film 207 from absorbing light in the opening region. Therefore, the planarization film 207 is arranged at a position overlapping the gate wirings GLn−1 to GLn+1 and the source wirings SL1 to SL4, in FIG. 6. The planarization film 207 is arranged in a region overlapping the conductive layer 206-4 and the transistor Tr, in FIG. 7. The planarization film 207 is removed in the opening region of the pixel PIX, so that the planarization film 207 is not arranged between the conductive layer 206-3 and a pixel electrode 216-1.

A transparent conductive layer 212 is arranged above the planarization film 207. A conductive layer 214 is arranged in contact with the transparent conductive layer 212. The transparent conductive layer 212 and the conductive layer 214 function as the capacitive wiring CW. The transparent conductive layer 212 and the conductive layer 214 are arranged at positions overlapping the gate wirings GLn−1 to GLn+1 and the source wirings SL1 to SL4 shown in FIG. 6. In addition, the conductive layer 214 also functions as a light-shielding layer. Although a configuration in which the conductive layer 214 is arranged above the transparent conductive layer 212 is described in the present embodiment, it may be a configuration in which the transparent conductive layer 212 is arranged above the conductive layer 214. An insulating film 209 is arranged above the conductive layer 214. Since the planarization film 207 is removed in the opening region, the insulating film 209 is in contact with the insulating film 205 in the opening region. The pixel electrode 216-1 is arranged above the insulating film 209. The pixel electrode 216-1 is connected to the conductive layer 206-3 via a contact hole arranged in the insulating films 205 and 209. The pixel electrode 216-1 is arranged in the opening region of the pixel PIX. The pixel electrode 216-1 does not cover the source wiring SL and the transistor Tr, but covers part of the conductive layer 206-3.

An end portion of the transparent conductive layer 212 is arranged between an end portion of the conductive layer 214 and the pixel electrode 216-1 above the planarization film 207 overlapping the transistor Tr, as shown in FIG. 7. The transistor Tr can be shielded from light, and the light transmittance in the opening region can be improved with this arrangement.

The counter substrate 152 is arranged to face the array substrate 150. The light-shielding layer 219, the common electrode 218, and an insulating film 221 are arranged in the counter substrate 152. The light-shielding layer 219 functions as a black matrix BM (FIG. 6). The configuration of the light-shielding layer 219 shown in FIG. 7 is arranged in the region overlapping the conductive layer 206-4, in FIG. 8. The light-shielding layer 219 is arranged in a grid pattern so as to cover the gate wirings GLn−1 to GLn+1 and the source wirings SL1 to SL4. The common electrode 218 has a size that extends over the entire surface of a display region 112. The light-shielding layer 219 may be formed of a metal film, and functions as an auxiliary electrode by being arranged in contact with the common electrode 218 formed of a transparent conductive film. The liquid crystal layer 210 is arranged between the array substrate 150 and the counter substrate 152 and is sealed with the seal material 154 (see FIG. 1). A liquid crystal element LE is configured by the pixel electrode 216-1, the liquid crystal layer 210, and the common electrode 218.

Next, the region 250 where the gate wiring GL and the source wirings SL1 to SL4 intersect each other will be described with reference to FIG. 8 to FIG. 12.

Figure 8:
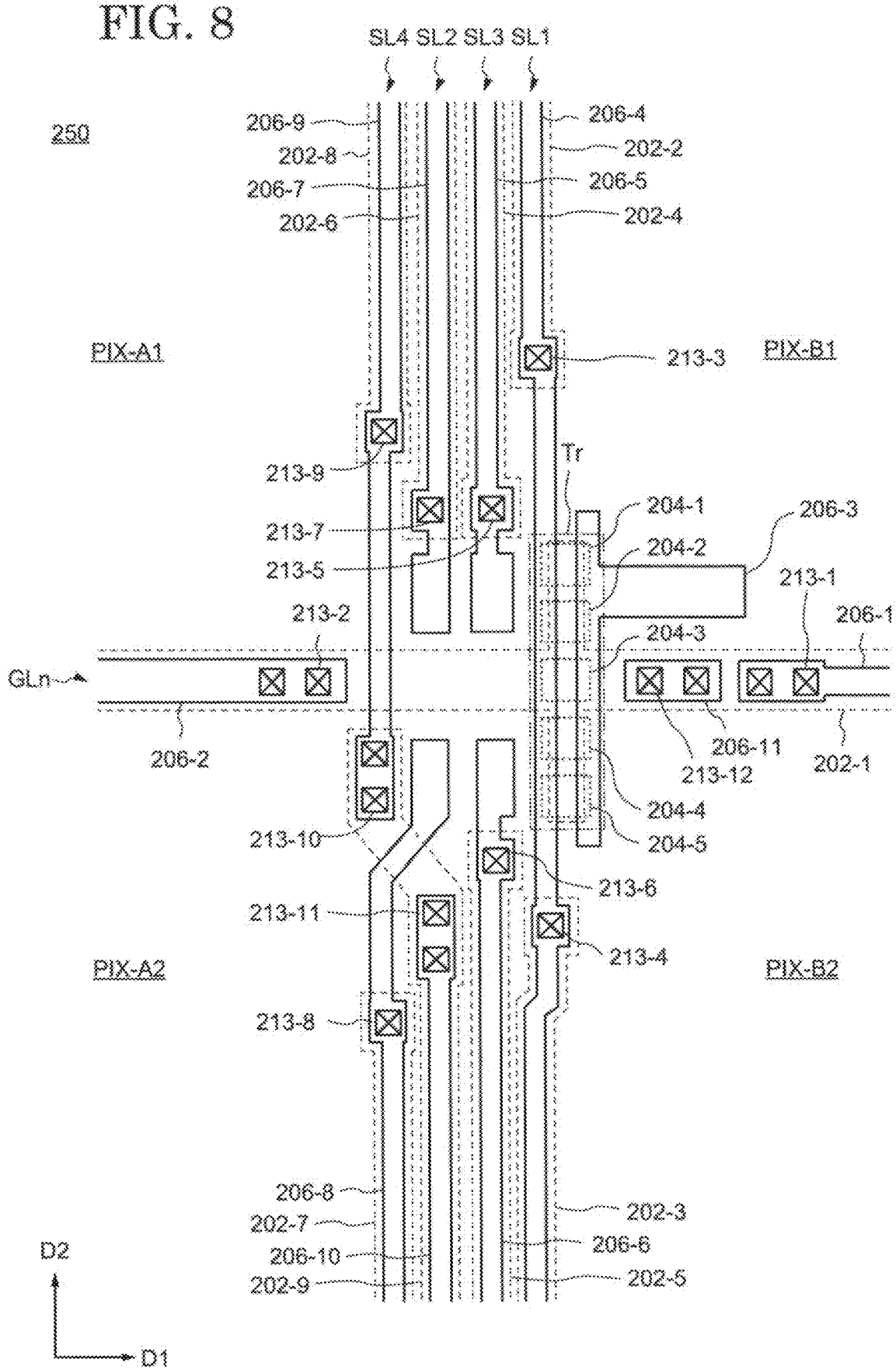
FIG. 8 is a planar layout of pixels in a display device according to an embodiment of the present invention.

FIG. 8 is a planar layout of the conductive layers 202-1 to 202-9, the oxide semiconductor layers 204-1 to 204-5, and the conductive layers 206-1 to 206-11 in the region 250. The conductive layers 202-1 to 202-9 are arranged above the array substrate 150. The conductive layer 202-1 has a region extending in the direction D1 (also referred to as a first region) and a region (also referred to as a second region) that intersects the first region in the direction D2. The intersecting region extends in the region in which the pixel PIX-B1 is arranged and the region in which the pixel PIX-B2 is arranged. That is, the gate wiring GL may have a cross-shaped pattern consisting of the first region and the second region on part of its wiring shape. In addition, the conductive layers 202-2 to 202-9 extend in the direction D2. An oxide semiconductor layer is arranged above the region intersecting the conductive layer 202-1 in the direction D2 via the gate insulating film 203 (see FIG. 7). The oxide semiconductor layer is divided into a plurality of layers. An example in which five the oxide semiconductor layers 204-1 to 204-5 are used to form the transistor Tr will be shown in the present embodiment. The oxide semiconductor layers 204-1 to 204-5 are arranged side by side in the direction D2. The oxide semiconductor layer 204-3 is arranged in a region overlapping the intersection with the region extending in the direction D1 of the conductive layer 202-1 and the region intersecting in the direction D2. The oxide semiconductor layers may be separately arranged in the plurality of oxide semiconductor layers 204-1 to 204-5 to reduce the effect of heat generation. The number of oxide semiconductor layers to be divided is not particularly limited. Light guided from the conductive layer 202-1 side to the glass substrate (the array substrate 150) toward the oxide semiconductor layers 204-1 to 204-5 is reflected by the conductive layer 202-1, and light leakage is less likely to occur in the oxide semiconductor layers 204-1 to 204-5, in the oxide semiconductor layers 204-1 to 204-5. The conductive layers 206-1 to 206-11 are arranged above the gate insulating film and the oxide semiconductor layers 204-1 to 204-5. The conductive layers 206-1, 206-2, and 206-11 extend in the direction D1 and the conductive layers 206-3 to 206-10 extend in the direction D2.

The conductive layer 202-1 overlaps the conductive layers 206-1, 206-2, and 206-11. The conductive layer 202-1 is connected to the conductive layer 206-1 via a contact hole 213-1 arranged in the gate insulating film 203, and is connected to the conductive layer 206-2 via a contact hole 213-2 arranged in the gate insulating film 203. A region of the conductive layer 202-1 extending in the direction D1 functions as the gate wiring. In addition, a region of the conductive layer 202-1 extending in the direction D2 functions as the gate electrode.

The conductive layers 202-2 and 202-3 overlap the conductive layer 206-4. The conductive layer 202-2 is connected to the conductive layer 206-4 via a contact hole 213-3 arranged in the gate insulating film 203. The conductive layer 202-3 is connected to the conductive layer 206-4 via a contact hole 213-4 arranged in the gate insulating film 203. The conductive layer 206-4 intersects the conductive layer 202-1. The conductive layer 206-4 functions as the first source wiring SL1. In addition, a region in the conductive layer 206-4 that does not overlap the conductive layers 202-2 and 202-3 functions as the source electrode of the transistor Tr. The conductive layer 206-3 functions as the drain electrode of the transistor Tr. The conductive layer 206-3 includes a region (also referred to as a third region) arranged along the direction D1 and a region (also referred to as a fourth region) arranged along the direction D2. A region of the conductive layer 206-3 arranged along the direction D1 is a region electrically connected to the pixel electrode 216. That is, the pixel electrode 216 is connected to the conductive layer 206-3 in the region arranged along the direction D1. In addition, a region of the conductive layer 206-3 along the direction D2 is arranged along the region that intersects the conductive layer 202-1 in the direction D2. The region arranged along the direction D2 is a region connected to the oxide semiconductor layers 204-1 to 204-5.

The conductive layer 202-4 overlaps the conductive layer 206-5 and is connected to the conductive layer 206-5 via a contact hole 213-5 arranged in the gate insulating film 203. The conductive layer 202-5 overlaps the conductive layer 206-6 and is connected to the conductive layer 206-6 via a contact hole 213-6 arranged in the gate insulating film 203. The conductive layer 206-5 is connected to the conductive layer 206-6 via a conductive layer 208-2 (see FIG. 10). As a result, the conductive layer 206-5, the conductive layer 206-6, and the conductive layer 208-2 function as the third source wiring SL3.

The conductive layer 202-6 overlaps the conductive layer 206-7 and is connected to the conductive layer 206-7 via a contact hole 213-7 arranged in the gate insulating film 203. The conductive layer 202-7 overlaps the conductive layer 206-8 and is connected to the conductive layer 206-8 via a contact hole 213-8 arranged in the gate insulating film 203. The conductive layer 206-7 is connected to the conductive layer 206-8 via a conductive layer 208-3 (see FIG. 10). The conductive layer 206-7, the conductive layer 206-8, and the conductive layer 208-3 function as the second source wiring SL2.

The conductive layer 202-8 overlaps the conductive layer 206-9 and is connected to the conductive layer 206-9 via a contact hole 213-9 arranged in the gate insulating film 203. The conductive layer 202-9 overlaps the conductive layer 206-9 and the conductive layer 206-10. The conductive layer 202-9 is connected to the conductive layer 206-9 via a contact hole 213-10 arranged in the gate insulating film 203. The conductive layer 202-9 is connected to the conductive layer 206-10 via a contact hole 213-11 arranged in the gate insulating film 203. The conductive layer 206-9 has a region that intersects the conductive layer 202-1. The conductive layer 206-9 and the conductive layer 206-10 function as the fourth source wiring SL4.

In addition, the conductive layer 202-1 overlaps the conductive layer 206-11 and is connected to the conductive layer 206-11 via a contact hole 213-12 arranged in the gate insulating film 203.

The conductive layer 202-9 and the conductive layer 206-8 have a bent region. The conductive layer 202-9 has a region that overlaps and intersects the conductive layer 206-8. That is, the second source wiring SL2 and the fourth source wiring SL4 have a region intersecting each other.

Although not described in detail, the conductive layer 202-2 and the conductive layer 206-5 have a bent region, as shown in FIG. 6. The conductive layer 202-2 has a region that overlaps and intersects the conductive layer 206-5. That is, the first source wiring SL1 has a region that intersects the third source wiring SL3.

The gate wiring GL is formed by stacking the conductive layer 202-1 and the conductive layers 206-1 and 206-2, as shown in FIG. 8. The conductive layer 202-1 extends along the direction D1. In addition, in the gate wiring GL, only the conductive layer 202-1 is arranged, and the conductive layer 206-1 and the conductive layer 206-2 are arranged separately from each other, in a region that intersects the source wiring SL1 to the source wiring SL4. In addition, the source wiring SL1 is formed by stacking the conductive layers 202-2 and 202-3 and the conductive layer 206-4. Further, in the source wiring SL1, only the conductive layer 206-4 is arranged, and the conductive layer 202-2 and the conductive layer 202-3 are arranged separately from each other, in a region that intersects the gate wiring GL. As a result, even if static electricity is generated in the manufacturing process of the display region 12 and the peripheral region 14 in an array substrate 101, the static electricity can be released, and the generation of defects caused by the static electricity can be suppressed.

Figure 9:
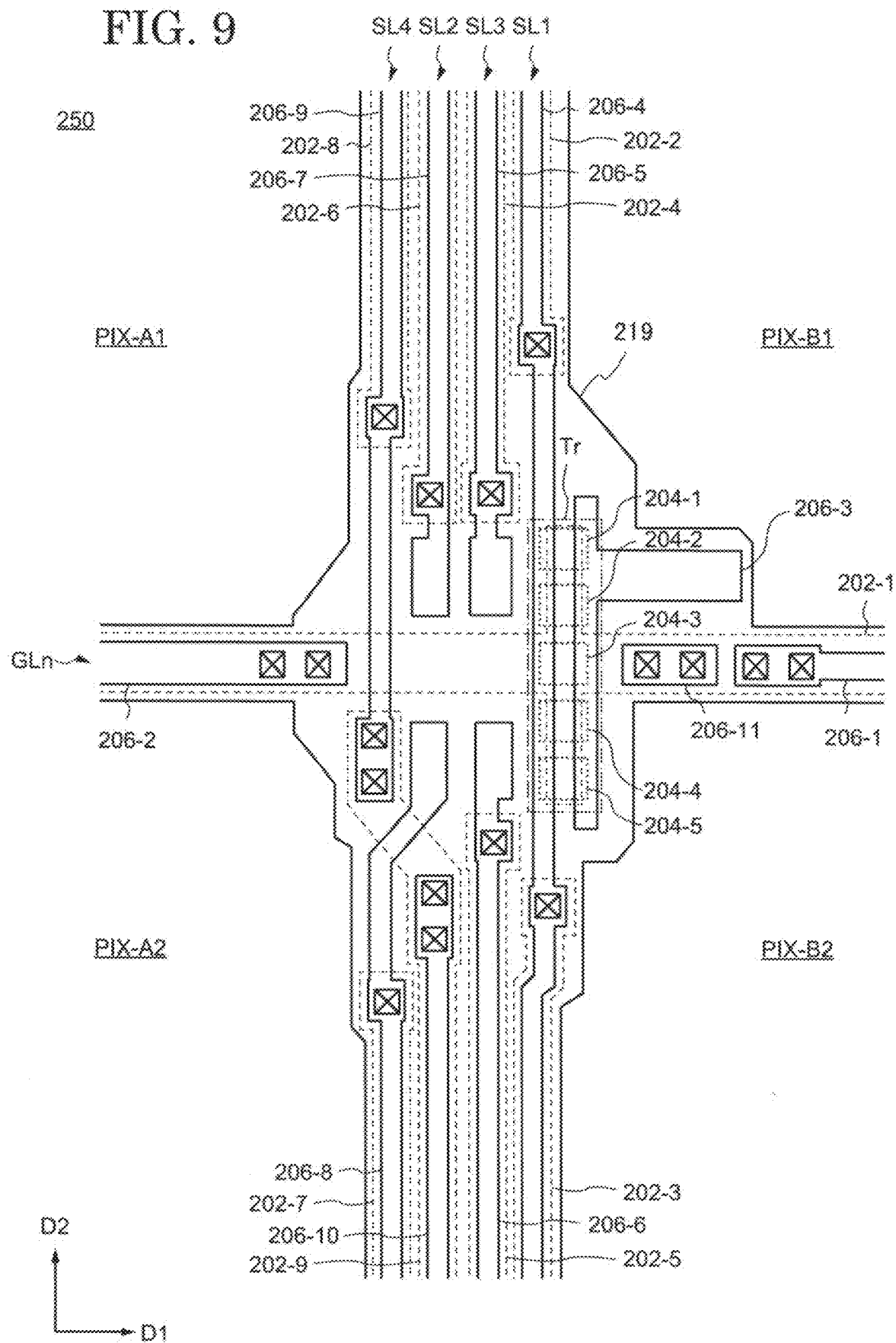
FIG. 9 is an enlarged plan view of pixels in a display device according to an embodiment of the present invention.

FIG. 9 is a planar layout of the conductive layers 202-1 to 202-9, the oxide semiconductor layers 204-1 to 204-5, the conductive layers 206-1 to 206-11, and the light-shielding layer 219, in the region 250. The light-shielding layer 219 arranged in the counter substrate 152 is arranged in a grid pattern so as to cover the conductive layers 202-1 to 202-9, the oxide semiconductor layers 204-1 to 204-5, and the conductive layers 206-1 to 206-11, as shown in FIG. 9. The light-shielding layer 219 covers a region of the conductive layer 202-1 extending in the direction D1, a region arranged to intersect in the direction D2, a region of the conductive layer 206-3 extending in the direction D1, and a region that intersects in the direction D2. In addition, an area of the opening arranged in the light-shielding layer 219 defines the aperture ratio of the pixel PIX. Further, an area of the light-shielding layer 219 covering the transistor Tr affects the aperture ratio of the pixel PIX. The relationship between the transistor Tr and the aperture ratio will be described in detail later.

Figure 10:
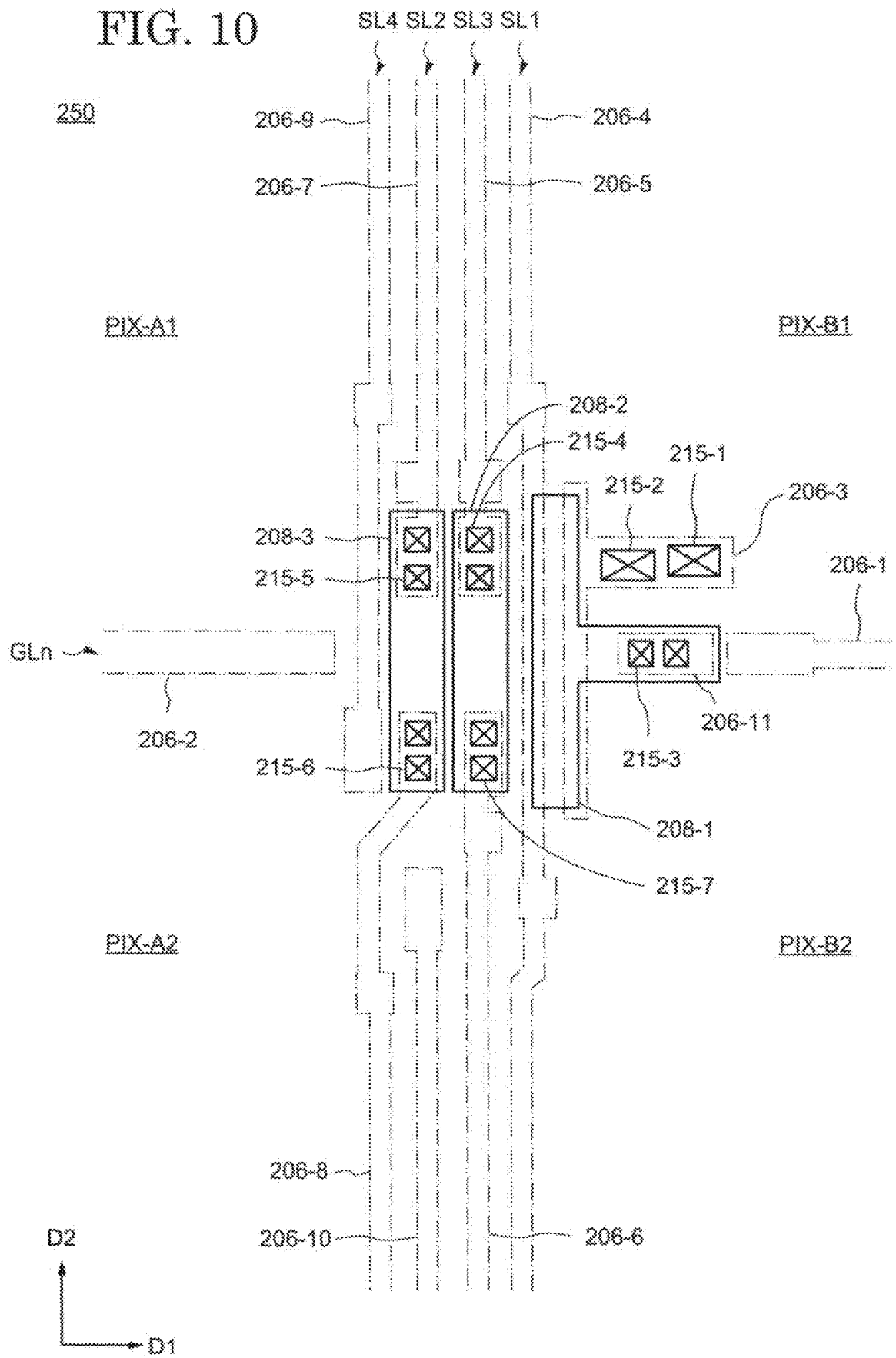
FIG. 10 is an enlarged plan view of pixels in a display device according to an embodiment of the present invention.

FIG. 10 is a planar layout of the conductive layers 206-1 to 206-11 and the conductive layers 208-1 to 208-3 in the region 250. The conductive layers 206-1 to 206-11 are as described in FIG. 8. The conductive layers 208-1 to 208-3 are arranged above the insulating film 205 (see FIG. 7). The conductive layer 208-1 has a region (also referred to as a third region) extending in the direction D1 and a region (also referred to as a fourth region) extending in the direction D2. The region extending in the direction D2 overlaps a region of the oxide semiconductor layers 204-1 to 204-5 and the conductive layer 202 extending in the direction D2 (also referred to as a second region). In addition, the conductive layer 208-1 in the region extending in the direction D1 overlaps the conductive layer 206-11, and is connected to the conductive layer 206-11 via a contact hole 215-3 arranged in the insulating film 205. As a result, a scanning signal supplied to the gate wiring GL is supplied to the conductive layer 208-1. That is, the conductive layer 208-1 functions as the back gate of the transistor Tr. In addition, the region of the conductive layer 208-1 extending in the direction D1 does not overlap the region of the conductive layer 206-3 extending in the direction D1. The conductive layer 208-2 extends in the direction D2. The conductive layer 208-2 overlaps the conductive layer 206-5 and the conductive layer 206-6, and is connected to the conductive layer 206-5 and the conductive layer 206-6 via contact holes 215-4 and 215-7 arranged in the insulating film 205. The conductive layer 208-3 extends in the direction D2. The conductive layer 208-3 overlaps the conductive layer 206-7 and the conductive layer 206-8, and is connected to the conductive layer 206-7 and the conductive layer 206-8 via contact holes 215-5 and 215-6 arranged in the insulating film 205.

Figure 11:
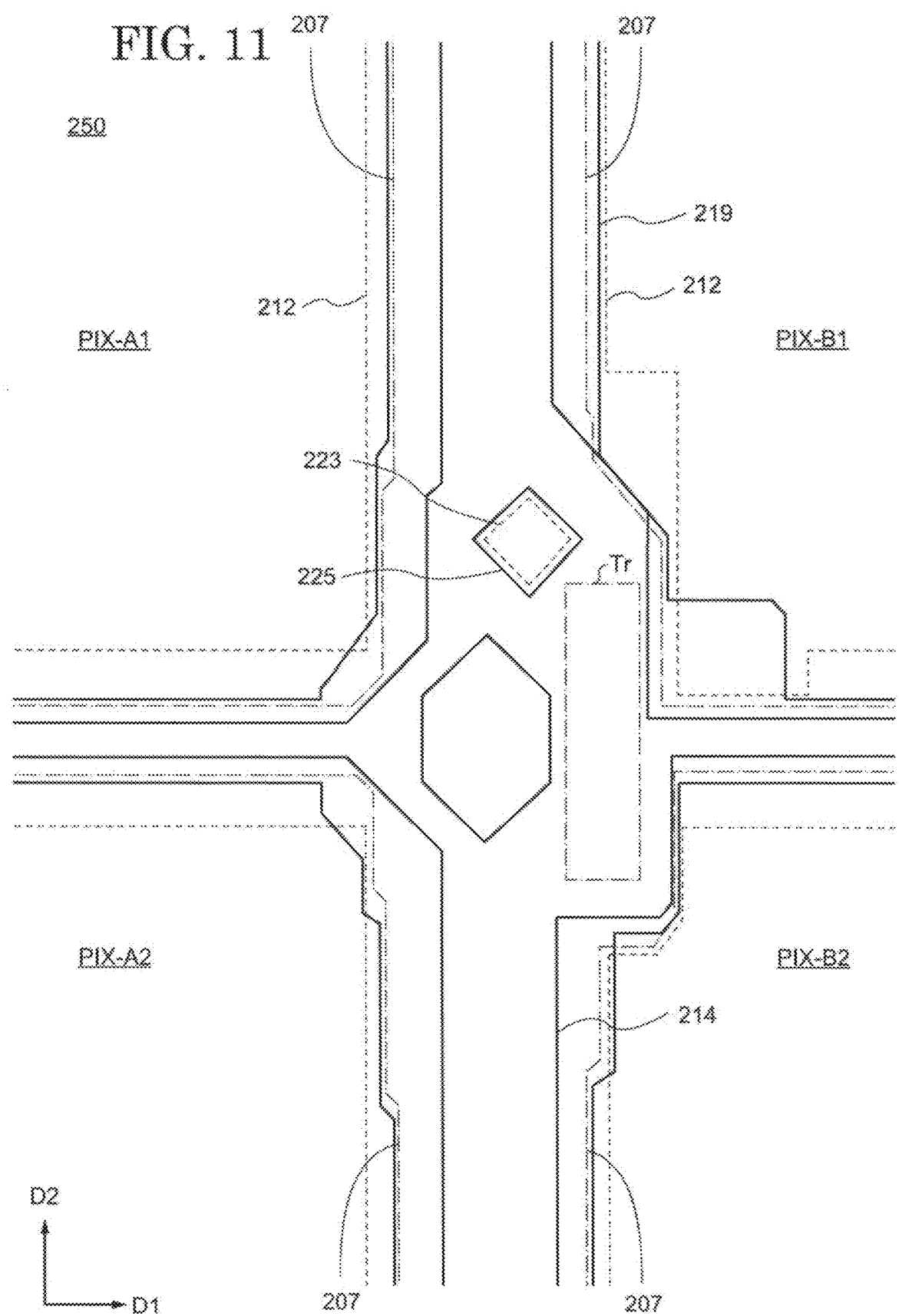
FIG. 11 is an enlarged plan view of pixels in a display device according to an embodiment of the present invention.

FIG. 11 is a planar layout of the planarization film 207, the transparent conductive layer 212, and the conductive layer 214 in the region 250. The planarization film 207 has been removed in the opening region of the pixels PIX1 to PIX4 as shown in FIG. 4. That is, the planarization film 207 is arranged above the wiring region. The transparent conductive layer 212 is arranged above the planarization film 207. In addition, the conductive layer 214 is arranged above the transparent conductive layer 212. The transparent conductive layer 212 and the conductive layer 214 function as the capacitive wiring CW. The conductive layer 214 covers the region of the conductive layer 202-1 extending in the direction D1, the region arranged to intersect in the direction D2, and the region of the conductive layer 206-3 extending in the direction D1. On the other hand, the region of the conductive layer 206-3 extending in the direction D2 is exposed from the transparent conductive layer 212. The transparent conductive layer 212 is arranged above the conductive layers 206-1 to 206-11 via the planarization film 207. Therefore, since the source wirings SL1 to SL4 and the capacitive wiring CW wiring are arranged so as to be separated from each other, it is less likely to be affected by the potential from the capacitive wiring CW. In addition, the electrical resistance of the conductive layer 214 is smaller than the electrical resistance of the transparent conductive layer 212. Therefore, variation in the convergence degree when the potential of the capacitive wiring CW varies depending on the position where the pixel PIX is located in the display region 12 is suppressed. In addition, the transparent conductive layer 212 has an opening 223 and the conductive layer 214 has an opening 225. The opening 223 and the opening 225 are arranged so as to overlap each other. The opening 223 and the opening 225 are arranged at positions not overlapping the transistor Tr.

The transparent conductive layer 212 and the conductive layer 214 are arranged in a grid pattern so as to cover the gate wiring GL and the source wirings SL1 to SL4. The storage capacitor C is adjusted according to the size of a region without the transparent conductive layer 212. In addition, the transparent conductive layer 212 may not be in the grid pattern, but may be arranged on the entire surface. In addition, the conductive layer 214 is arranged so as to cover the transistor Tr. As a result, optical leakage of the transistor Tr can be suppressed.

Although an example in which the conductive layer 214 is arranged above the transparent conductive layer 212 is shown, it may be arranged below the transparent conductive layer 212. The conductive layer 214 may be stacked with the transparent conductive layer 212. The conductive layer 214 has a light-shielding effect. Therefore, the wiring region can be shielded from light. The conductive layer 214 is arranged so as to have a width smaller than a combined width of the source wirings SL1 to SL4, in a plan view. In addition, although the width of the conductive layer 214 has a width similar to a width of the gate wiring GL, it may be arranged to be smaller than the width of the gate wiring GL. As a result, it is possible to suppress the display panel 102 from emitting the reflected light reflected by the edge of the source wiring SL. In addition, the width of the conductive layer 214 or the combined width of the source wirings SL1 to SL4 refer to lengths in a direction (the direction D1) intersecting the direction in which the source wirings SL1 to SL4 extend. Further, the width of the gate wiring GL refers to a length in a direction (the direction D2) intersecting the direction in which the gate wiring GL extends.

Figure 12:
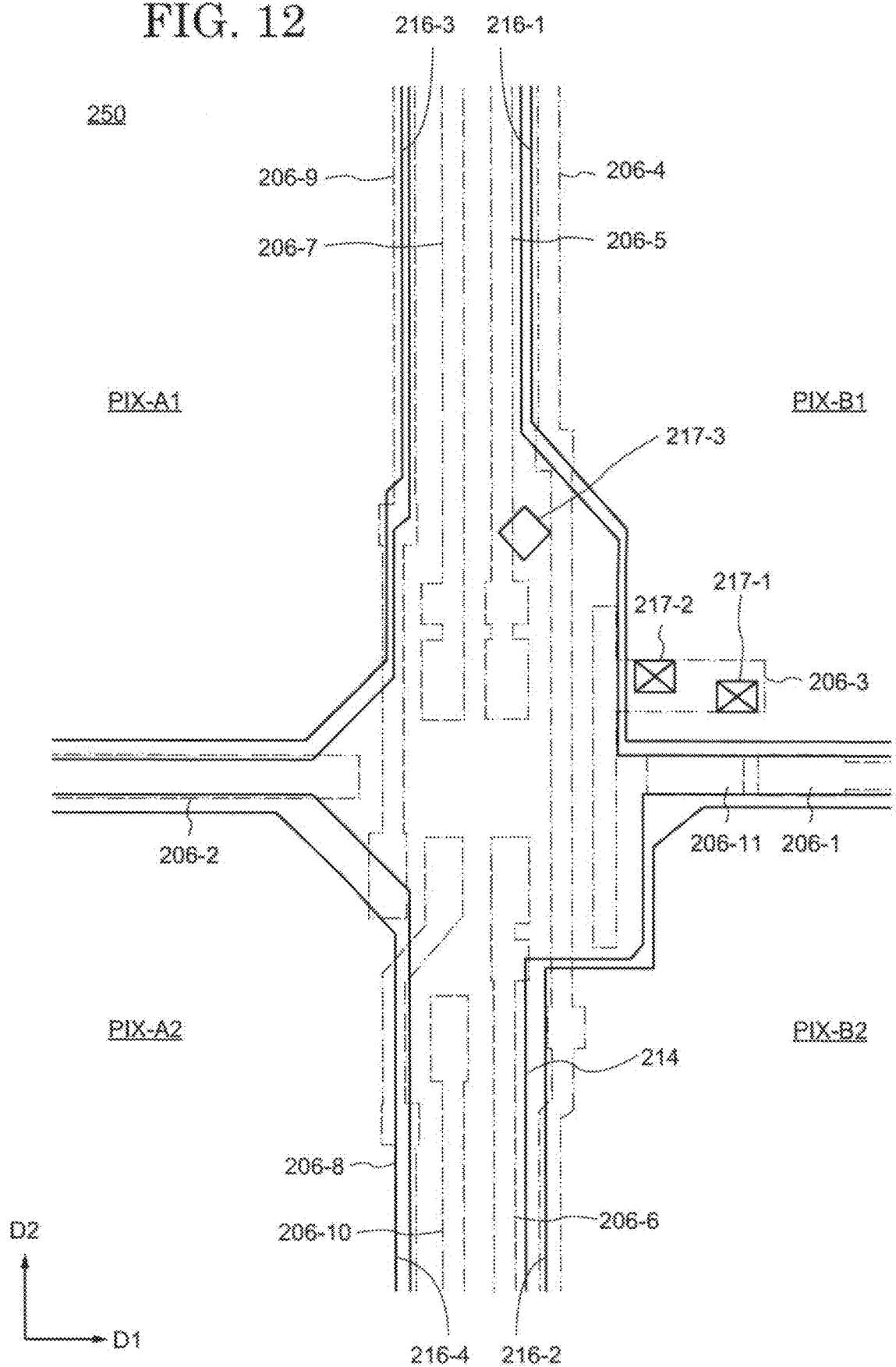
FIG. 12 is an enlarged plan view of pixels in a display device according to an embodiment of the present invention.

FIG. 12 is a planar layout of the conductive layers 206-1 to 206-11, the conductive layer 214, and the pixel electrodes 216-1 to 216-4 in the region 250. The conductive layers 206-1 to 206-11 are as described in FIG. 8. The conductive layer 214 is as described in FIG. 11. A region of the conductive layer 206-3 extending in the direction D2 is exposed from the conductive layer 214. The pixel electrodes 216-1 to 216-4 are arranged above the insulating film 209. The pixel electrodes 216-1 to 216-4 are arranged in the opening region of the pixel PIX. The pixel electrode 216-1 is connected to the region of the conductive layer 206-3 extending in the direction D1 via contact holes 217-1 and 217-2 arranged in the insulating film 209 and contact holes 215-1 and 215-2 (see FIG. 9) arranged in the insulating film 205. In addition, the insulating film 209 has an opening 217-3. The opening 217-3 is arranged so as to overlap the opening 223 and the opening 225. Since the openings 223 and 225 and the opening 217-3 are arranged above the planarization film 207, water contained in the planarization film 207 can be discharged via the openings 223 and 225 and the opening 217-3.

The conductive layer 202 and the conductive layer 206 are arranged so as to be stacked on each other and extend as the gate wiring GL and the source wirings SL1 to SL4, in the display region 12. Since the source wirings SL1 to SL4 are arranged so that the conductive layer 202 and the conductive layer 206 are stacked and extended, resistance of the source wirings SL1 to SL4 can be made uniform and wiring capacitance can be made uniform. In addition, the source wiring SL1 and the source wiring SL3 can be arranged to intersect each other, and the source wiring SL2 and the source wiring SL4 can be arranged to intersect each other.

Figure 13:
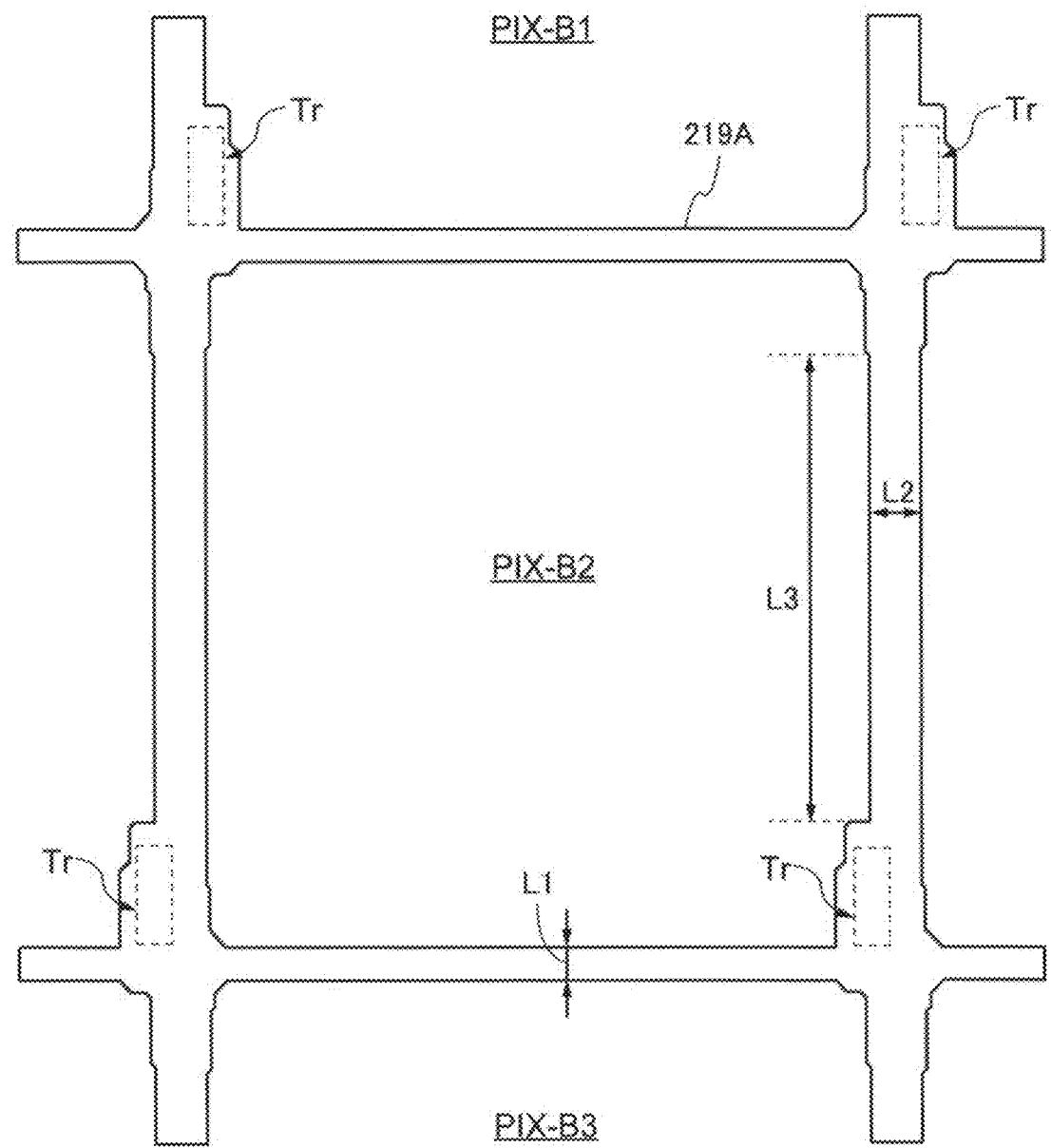
FIG. 13 is a diagram illustrating an aperture ratio of a pixel in a display device of a comparative embodiment.
Figure 14:
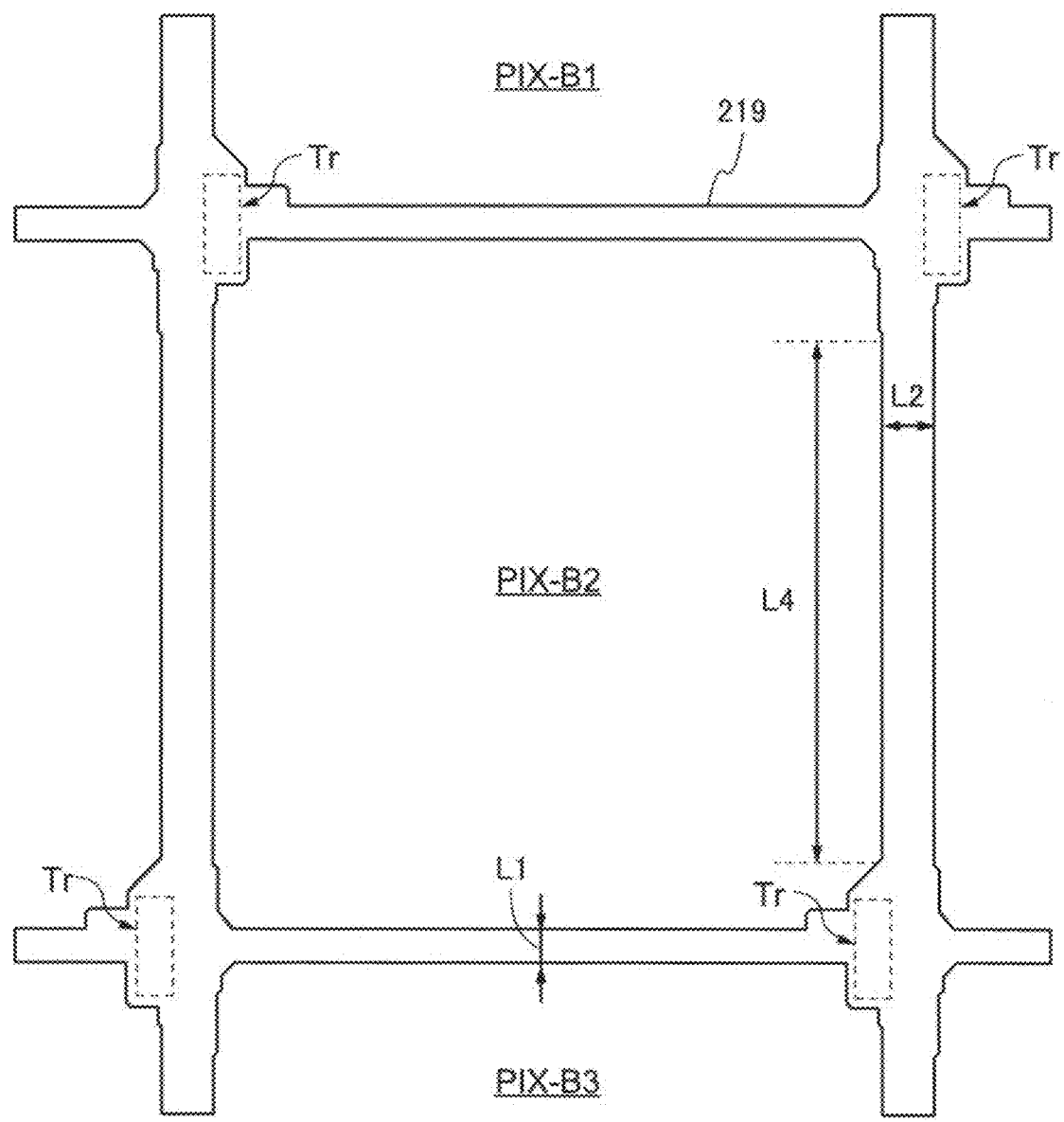
FIG. 14 is a diagram illustrating an aperture ratio of a pixel in a display device according to an embodiment of the present invention.

Next, the aperture ratio of the display device 10 will be described with reference to FIG. 13 and FIG. 14. FIG. 13 is a diagram illustrating an aperture ratio of a pixel of the display device of a comparative embodiment. FIG. 14 is a diagram illustrating an aperture ratio of a pixel of the display device 10 according to an embodiment of the present invention.

FIG. 13 shows a light-shielding layer 219A covering the gate wiring GL, the source wirings SL1 to SL4, and the transistor Tr. A width in a region that overlaps the gate wiring GL is defined as a length L1, and a width in the region that overlaps the source wirings SL1 to SL4 is defined as a length L2, in the light-shielding layer 219A. The length L2 is longer than the length L1 in this case. In addition, a length of the region extending in the direction D2 in the length L2 is defined as a length L3, in the light-shielding layer 219A.

FIG. 14 shows the light-shielding layer 219 covering the gate wiring GL, the source wirings SL1 to SL4, and the transistor Tr. A width in the region that overlaps the gate wiring GL is defined as a length L1, and a width in the region that overlaps the source wirings SL1 to SL4 is defined as a length L2, in the light-shielding layer 219. The length L1 and the length L2 shown in FIG. 14 are the same as the length L1 and the length L2 shown in FIG. 13. In addition, a length of a region extending in the direction D2 in the length L2 in the light-shielding layer 219 is defined as a length L4.

The transistor Tr for driving the pixel PIX-B2 is arranged in the pixel PIX-B2, in the display device of the comparative embodiment, as shown in FIG. 13. Therefore, the length L3 of the region extending in the direction D2 at the length L2 is affected by the region where the transistor Tr is arranged. On the other hand, not only the pixel PIX-B2 but also the transistor Tr that drives the pixel PIX-B2 is arranged in the adjacent pixel PIX-B3 in the direction D2, in the display device 10, as shown in FIG. 14. As a result, the length L4 of the region extending in the length L2 can be made longer than the length L3. As a result, the aperture ratio of the pixel PIX of the display device 10 can be improved as compared with the aperture ratio of the pixel PIX of the display device of the comparative embodiment. In addition, the visibility of the light-shielding layer 219 overlapping the source wirings SL1 to SL4 can be reduced. Further, the appearance at the intersection of the gate wiring GL and the source wirings SL1 to SL4 can be improved.

Materials of Each Member of Display Device 10

A rigid substrate such as a glass substrate, a quartz substrate, and a sapphire substrate having light transmittance and no flexibility can be used as the array substrate 150 and the counter substrate 152. On the other hand, in the case where the array substrate 150 and the counter substrate 152 need to have flexibility, a flexible substrate containing a resin and having flexibility, such as a polyimide substrate, an acryl substrate, a siloxane substrate, or a fluororesin substrate can be used as the array substrate 150 and the counter substrate 152. In order to improve the heat resistance of the array substrate 150 and the counter substrate 152, impurities may be introduced into the resin. In addition, in the case where the display device 10 is applied to a transparent display or a large display, a glass substrate is preferably used as the array substrate 150 and the counter substrate 152. In addition, the first transparent substrate 151A and the second transparent substrate 151B are arranged to protect the array substrate 150 and the counter substrate 152. For this reason, for example, it is preferable to use a glass substrate, a plastic substrate, or the like having light transmittance.

A single layer or a stacked structure of silicon nitride ($SiN_x$), silicon nitride oxide ($SiN_xO_y$), aluminum nitride ($AlN_x$), aluminum nitride oxide ($AlN_xO_y$), silicon oxide ($SiO_x$), silicon oxynitride ($SiO_xN_y$), aluminum oxide ($AlO_x$), aluminum oxynitride ($AlO_xN_y$) is used as the gate insulating film 203, the insulating film 205, and the insulating film 209. The gate insulating film 203 is constituted by a stacked structure of the nitride insulating film 203a and the oxide insulating film 203b, in the present embodiment. In addition, the insulating film 205 is constituted by the oxide insulating film 205a and the nitride insulating film 205b. Silicon nitride is used as the nitride insulating films 203a and 205b and the insulating film 209. For example, the silicon nitride film is formed by a sputtering method. In addition, silicon oxide is used as the insulating films 203b and 205a.

$SiO_xN_y$ and $AlO_xN_y$ are a silicon compound and an aluminum compound containing a smaller proportion (x>y) of nitrogen (N) than oxygen (O). $SiN_xO_y$ and $AlN_xO_y$ are a silicon compound and an aluminum compound containing a smaller proportion of oxygen than nitrogen (x>y).

An organic insulating material such as a polyimide resin, an acryl resin, an epoxy resin, a silicone resin, a fluororesin, or a siloxane resin can be used as the planarization film 207.

Common metal materials can be used as the conductive layers 202, 206, and 208 and the conductive layer 214. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and an alloy or compound thereof are used as these members. The above-described material may be used in a single layer or in a stacked layer as the above members.

An oxide semiconductor having semiconductor characteristics can be used as the oxide semiconductor layer 204. The oxide semiconductor layer 204 has light transmittance. For example, an oxide semiconductor containing two or more kinds of metals including indium (In) is used as the oxide semiconductor layer 204. For example, an oxide semiconductor containing indium (In), gallium (Ga), zinc (Zn), and oxygen (O) may be used as the oxide semiconductor layer 204. In particular, an oxide semiconductor having a composition ratio of In:Ga:Zn:O=1:1:1:4 may be used.

A mixture of indium oxide and tin oxide (ITO) and a mixture of indium oxide and zinc oxide (IZO) can be used as the transparent conductive layer 212, the pixel electrode 216, and the common electrode 218. A material other than the above may be used as the transparent conductive layer. The light-shielding layer 219 used for the black matrix BM may be formed of a black resin or metal material. The black matrix BM is formed in contact with the common electrode 218 (see FIG. 7). While the common electrode 218 is formed of a transparent conductive film, and the black matrix BM is formed of a metal material, it is possible to provide a function as an auxiliary electrode for reducing resistance dissipation. The black matrix BM may be formed of a single layer or a stacked layer of chrome, molybdenum, titanium, or the like having relatively low reflectance with respect to aluminum.

In the case where the display device 10 is applied to a transparent display, a polymer-dispersed liquid crystal is preferably used as the liquid crystal layer 210. The polymer-dispersed liquid crystal includes bulk and fine particles. The orientation of the fine particles changes in the bulk depending on the potential difference between the pixel electrode 216 and the common electrode 218. The degree of at least one of light transmission and distribution is controlled for each pixel PIX by individually controlling the potential of the pixel electrode 216 for each pixel PIX. The degree of scattering of the liquid crystal layer (fine particles) is controlled depending on the voltage of the pixel electrode 216 and the voltage of the common electrode 218. For example, a polymer-dispersed liquid crystal in which the degree of scattering increases as the voltage between each pixel PIX and the common electrode 218 increases, or a polymer-dispersed liquid crystal in which the degree of scattering increases as the voltage between each pixel electrode 216 and the common electrode 218 decreases may be used as the liquid crystal layer.

The ordinary refractive indices of the bulk and the fine particles are equal to each other in the liquid crystal layer 210. In the case where no voltage is applied between the pixel electrode 216 and the common electrode 218, the refractive index difference between the bulk and the fine particles is zero in all directions. The liquid crystal layer 210 is in the non-scattering state, in which the light emitted from the light source is not scattered. The light emitted from light source propagates away from the light source 104 (light-emitting unit) while being reflected on the first main surface of the array substrate 150 and the first main surface of the counter substrate 152. In the case where the liquid crystal layer 210 is in the non-scattering state, in which the light L emitted from light source is not scattered, the background of the counter substrate 152 can be visually recognized from the array substrate 150 and the background of the array substrate 150 can be visually recognized from the counter substrate 152.

Between the pixel electrode 216 and the common electrode 218 to which the voltage is applied, the optical axis of the fine particles will be tilted by the electric field generated between the pixel electrode 216 and the common electrode 218. Since the optical axis of the bulk does not change depending on the electric field, the orientations of the optical axis of the bulk and the optical axis of the fine particles are different from each other. In the pixel PIX of the pixel electrode 216 to which the voltage is applied, the light emitted from the light source is scattered. Light in which part of the light emitted from the light source and scattered as described above is emitted to the outside from the first main surface of the array substrate 150 or the first main surface of the counter substrate 152 is observed by the observer.

The background of the first main surface of the counter substrate 152 is visually recognized from the first main surface of the array substrate 150, and the background of a first main surface 10A of the array substrate 150 is visually recognized from a first main surface 20A of the counter substrate 152, in the pixel PIX having the pixel electrode 216 with no voltage applied. Then, when a video signal is input, a voltage is applied to the pixel electrode 216 of the pixel PIX on which an image is displayed, and an image based on the video signal is visually recognized together with the background, in the display device 10 of the present embodiment. In this way, when the polymer-dispersed liquid crystal is in the scattering state, an image is displayed in the display region.

While preferred embodiments have been described above, the present invention is not limited to such embodiments. The contents disclosed in the embodiments are merely examples, and various changes can be made without departing from the spirit of the present invention. Appropriate changes that have been made without departing from the spirit of the present invention naturally fall within the technical scope of the present invention.

What is claimed is:

1. A display device comprising:
   a first conductive layer having a first region extending in a first direction and a second region intersecting the first region on a first substrate;
   a first insulating film arranged on the first conductive layer;
   an oxide semiconductor layer arranged along the second region on the first insulating film;
   a second conductive layer and a third conductive layer connected to the oxide semiconductor layer and arranged along the second region;
   a second insulating film arranged on the third conductive layer;
   a pixel electrode arranged on the second insulating film; and
   a fourth conductive layer arranged on the second insulating film,
   wherein the third conductive layer has a third region along the first direction and a fourth region along the second region, and
   the pixel electrode is connected to the third conductive layer in the third region via an opening in the second insulating film,
   the fourth conductive layer has a fifth region overlapping the first region and a sixth region overlapping the oxide semiconductor layer, and
   the fourth conductive layer in the fifth region is connected to the first conductive layer in the first region.

2. The display device according to claim 1, wherein the oxide semiconductor layer is divided into a plurality of layers.

3. The display device according to claim 2, wherein one of the plurality of layers in the oxide semiconductor layer is arranged in a region overlapping an intersection of the first region and the second region of the first conducting layer.

4. The display device according to claim 1, wherein the first region in the first conductive layer does not overlap the third region in the third conductive layer.

5. The display device according to claim 1, further comprising:
   a fifth conductive layer arranged between the fourth conductive layer and the pixel electrode,
   wherein the fifth conductive layer overlaps the first region, the second region, and the fourth region, and a part of the third region is exposed from the fifth conductive layer.

6. The display device according to claim 1, further comprising:
   a second substrate arranged opposite the first substrate; and
   a shielding layer on the second substrate,
   wherein the shielding layer overlaps the first region and the second region in the first conductive layer, and the third region and the fourth region in the third conductive layer.

7. The display device according to claim 6, further comprising:
   a liquid crystal layer arranged between the first substrate and the second substrate; and
   a light source arranged so that light enters toward a side surface of the first substrate or a side surface of the second substrate.

8. The display device according to claim 7, wherein the liquid crystal layer is a polymer-dispersed liquid crystal,
   an image is displayed in a display region when the polymer-dispersed liquid crystal is in a scattering state, and
   a background of the second substrate is visible from the first substrate and a background of the first substrate is visible from the second substrate in the display region when the polymer-dispersed liquid crystal is in a non-scattering state.

* * * * *